United States Patent
Kong et al.

(10) Patent No.: US 11,455,118 B1
(45) Date of Patent: Sep. 27, 2022

(54) METHOD FOR REDUNDANT ARRAY OF INDEPENDENT DISKS STRIPING AGAINST PROGRAMMING FAILURES AND APPARATUS THEREOF

(71) Applicant: YANGTZE MEMORY TECHNOLOGIES CO., LTD., Wuhan (CN)

(72) Inventors: Weizhen Kong, Wuhan (CN); Jian Cao, Wuhan (CN); Wei Tao, Wuhan (CN); Ling Du, Wuhan (CN); Yuan Tao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/217,936

(22) Filed: Mar. 30, 2021

Related U.S. Application Data

(63) Continuation of application No. PCT/CN2021/079221, filed on Mar. 5, 2021.

(51) Int. Cl.
*G06F 3/06* (2006.01)

(52) U.S. Cl.
CPC .......... *G06F 3/0655* (2013.01); *G06F 3/0604* (2013.01); *G06F 3/0689* (2013.01)

(58) Field of Classification Search
CPC .... G06F 3/0655; G06F 3/0604; G06F 3/0689; G06F 3/0679

USPC .................................................. 711/154, 103
See application file for complete search history.

(56) References Cited

U.S. PATENT DOCUMENTS

| | | |
|---|---|---|
| 10,915,394 B1 | 2/2021 | Shappir et al. |
| 2011/0302358 A1 | 12/2011 | Yu et al. |
| 2017/0293527 A1 | 10/2017 | Shappir et al. |
| 2018/0032395 A1 | 2/2018 | Yang et al. |

OTHER PUBLICATIONS

International Search Report issued in corresponding International Application No. PCT/CN2021/079221, dated Nov. 26, 2021, 5 pages.

*Primary Examiner* — Hashem Farrokh
(74) *Attorney, Agent, or Firm* — Bayes PLLC

(57) ABSTRACT

Implementations of the present disclosure provide a memory apparatus that includes a plurality of memory cells stored with memory data in N dies. Each of the N dies includes M planes. Each of the M planes includes a memory block. The apparatus also includes a controller configured to determine J layers in the memory block in each of the M planes and in each of the N dies, each of the J layers comprising a pair of adjacent gate conductive layers. The controller is also configured to determine M sets of stripes. Each of the M sets of stripes comprising a plurality of data portions stored in a respective one of the M planes. The controller is further configured to determine M sets of parity data portions. The controller is further configured to control a temporary storage unit to store the M sets of parity data portions.

20 Claims, 16 Drawing Sheets

METHOD FOR REDUNDANT ARRAY OF INDEPENDENT DISKS STRIPING AGAINST PROGRAMMING FAILURES AND APPARATUS THEREOF

CROSS-REFERENCE TO RELATED APPLICATIONS

This application is continuation of International Application No. PCT/CN2021/079221, filed on Mar. 5, 2021, entitled "METHOD FOR REDUNDANT ARRAY OF INDEPENDENT DISKS STRIPING AGAINST PROGRAMMING FAILURES AND APPARATUS THEREOF," which is hereby incorporated by reference in its entirety.

BACKGROUND

The present disclosure relates to data storage method and apparatus.

With the rapid growth in the Internet and various mission-critical applications, the importance of preserving data integrity and ensuring continuous access to critical information cannot be overstated. To satisfy the needs in preserving and accessing reliable data, redundant array of independent disks (RAID) algorithm has been used to improve the performance, reliability, power consumption, and scalability in NAND memory devices. RAID algorithm employs the techniques of striping, mirroring, and/or parity to create large reliable data stores from multiple storage units.

Amongst the different levels of RAIDs, the level 5 of RAID, a.k.a. RAID 5, is commonly used in preserving data integrity in NAND memory devices. RAID 5 employs of block-level striping with distributed parity (e.g., redundant information). The parity information is distributed among the drives. Upon failure of a single drive, the data in the failed drive can be retrieved from the distributed parity and the rest of the drives such that no memory data is lost.

SUMMARY

In one example, a memory apparatus is provided. The apparatus includes a plurality of memory cells stored with memory data in N dies. Each of the N dies includes M planes. Each of the M planes includes a memory block. N and M are each a positive integer. The apparatus also includes a controller operatively coupled to the plurality of memory cells. The controller is configured to determine J layers in the memory block in each of the M planes and in each of the N dies, each of the J layers comprising a pair of adjacent gate conductive layers. J is a positive integer. The controller is also configured to determine M sets of stripes. Each of the M sets of stripes comprising a plurality of data portions stored in a respective one of the M planes. The controller is further configured to determine M sets of parity data portions. Each of the M sets of parity data portions corresponding to a respective one of the M stripes. The controller is further configured to control a temporary storage unit to store the M sets of parity data portions.

In another example, a memory apparatus is provided. The apparatus includes a plurality of memory cells stored with memory data in N dies. Each of the N dies includes M planes. Each of the M planes includes a memory block. N and M are each a positive integer. The apparatus includes a controller operatively coupled to the plurality of memory cells. The controller is configured to determine J layers in the memory block in each of the M planes and in each of the N dies. Each of the J layers includes a pair of adjacent gate conductive layers. J is a positive integer of at least 2. The controller is also configured to determine J stripes each corresponding to M layers of the same level in the M planes and comprising M×N data portions. Each of the M×N data portions is stored in a respective portion of the respective M layers. The controller is further configured to determine J parity data portions each corresponding to a respective stripe. The controller is further configured to control a temporary storage unit to store the J parity data portions.

In another example, a method for operating a memory apparatus using RAID striping is provided. The apparatus includes a plurality of memory cells stored with memory data in N dies. Each of the N dies includes M planes. Each of the M planes includes a memory block. N and M are each a positive integer. The method includes determining J layers in the memory block in each of the M planes and in each of the N dies. Each of the J layers includes a pair of adjacent gate conductive layers. J is a positive integer. The method also includes determining M sets of stripes, each of the M sets of stripes comprising a plurality of data portions stored in a respective one of the M planes. The method also includes determining M sets of parity data portions. Each of the M sets of parity data portions corresponds to a respective one of the M stripes. The method further includes controlling a temporary storage unit to store the M sets of parity data portions.

In still another example, a method for operating a memory apparatus using RAID striping is provided. The apparatus includes a plurality of memory cells stored with memory data in N dies. Each of the N dies includes M planes. Each of the M planes includes a memory block. N and M are each a positive integer. The method includes determining J layers in the memory block in each of the M planes and in each of the N dies. Each of the J layers includes a pair of adjacent gate conductive layers. J is a positive integer of at least 2. The method also includes determining J stripes each corresponding to M layers of the same level in the M planes and comprising M×N data portions. Each of the M×N data portions is stored in a respective portion of the respective M layers. The method further includes determining J parity data portions each corresponding to a respective stripe. The method further includes controlling a temporary storage unit to store the J parity data portions.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1A:
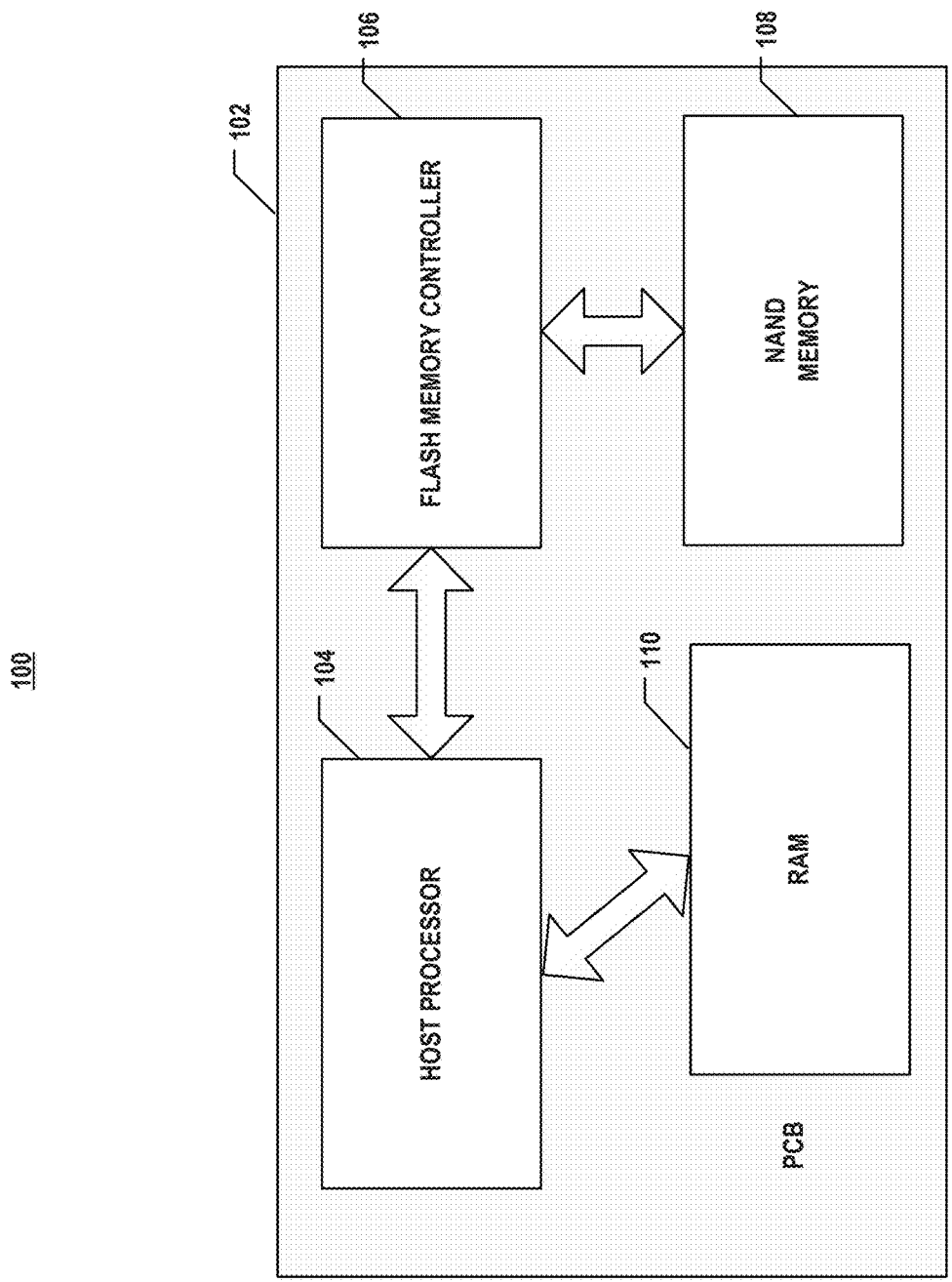
FIG. 1A illustrates a schematic diagram of an apparatus including a host processor, a Flash memory controller, a random-access memory (RAM), and NAND memory, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "memory string" refers to a vertically-oriented string of memory cell transistors connected in series on a laterally-oriented substrate so that the string of memory cell transistors extends in the vertical direction with respect to the substrate. As used herein, the term "vertical/vertically" means perpendicular to the lateral surface of a substrate.

To increase storage capacity, NAND Flash memories often include, laterally, multiple dies, each having multiple planes. Each plane is laterally divided into one or more memory blocks, each including multiple gate conductive layers extending laterally. One memory block includes a number of gate conductive layers arranged vertically in a number of levels, and each gate conductive layer is coupled to memory cells in multiple pages laterally distributed in the memory block. As the number gate conductive layers continue to increase vertically to increase the storage capacity of the NAND Flash memories, the space between adjacent gate conductive layers becomes smaller. Interferences between adjacent gate conductive layers become prominent. To improve the integrity and readability of the memory cells, RAID 5 has been widely used in NAND Flash memory. Typically, RAID 5 employs striping in memory blocks to divide the memory data in the memory blocks into a plurality of data portions, performing exclusive or (XOR) operations amongst data portions in the stripe to generate respective parity data, and stores the parity data in the memory cells. One data portion can represent the memory data in one page. One stripe often includes data portions located in two-dimensions, e.g., laterally in different memory blocks across different dies and different planes, and vertically in different levels in the same memory blocks. For example, for memory blocks in 4 planes and 4 dies, a stripe can include 128 data portions, distributed laterally (e.g., in all the planes and dies) and vertically (e.g., in more than one level). Laterally, the stripe can include data portions at the same locations in different planes. Vertically, the stripe can include data portions at the same locations in different levels. The last data portion often includes the parity data of the stripe. In case of programming failure in one data portion of a stripe, the compromised data portion can be recovered, e.g., by performing XOR operations, using the parity data of the stripe and the rest of the data portions in the stripe. For example, for a stripe that has 128 data portions, 127 data portions are used to store the memory data, and one data portion is used to store the parity data of the stripe, the error correction capability of RAID 5 using such striping configuration can thus be described as (127+1).

However, the RAID 5 can be used to recover only one compromised data portion in a stripe. In case of scenarios that cause two or more compromised data portions in a stripe, the RAID 5, with the striping configuration as described above, is incapable of recovering the more than one compromised data portion. For example, one scenario that can cause more than one compromised data portions in one stripe is a "multi-plane failure," which can be caused by programming errors when multiple planes are being programmed in parallel. Data portions, in the same stripe, at the same locations in different planes, can be compromised. Another scenario that can cause more than one compromised data portions in one stripe is a "source-select gate (SSG) leakage failure," which is caused by current leakage of SSG. The SSG leakage failure can cause the data portions coupled to the SSG, e.g., at the same locations in more than levels, to be compromised. The current striping configuration is susceptible to having more than one compromised data portions in a single stripe if one or both of the scenarios occur. As a result, memory data in these compromised data portions may be lost. The striping configuration of the RAID 5 needs to be improved.

To address one or more aforementioned issues, the present disclosure introduces a solution in which RAID technologies (e.g., RAID 5) can be used to recover more than one compromised data portion laterally and vertically. In these implementations, two adjacent gate conductive layers are defined as a layer, and each memory block includes a plurality of layers in the vertical direction. Compared to a RAID 5 in which a stripe includes data portions distributed laterally and vertically in memory blocks across the planes and the dies, the provided method employs stripes that are shorter. Temporary parity data are generated for each respective stripe. The temporary parity data can be stored in a temporary storage unit and used for recovering the compromised data portion in the respective stripe. The temporary parity data can be used to generate the parity data set for the stripes in all the planes and dies. When the temporary parity data is no longer needed, e.g., no programming failure detected or all the programming failures recovered, the temporary parity data can be removed from the temporary storage unit. No additional storage space is needed in the NAND memory for the temporary parity data portions. The error correction capability of RAID 5 can be improved without adding complexity to the algorithm. In an example, for one memory block in 4 planes and 4 dies, the error correction capability of RAID 5 can be described as (127+X), in which 127 represents the number of data portions stored with memory data, and X represents the number of data portions in which programming failures occur, where X is a positive integer greater than 1. That is, for the same number of memory cells in the apparatuses, more compromised memory data can be recovered. The data reliability of the apparatuses can be improved.

To improve the error correction capability, various striping configurations have been proposed. These striping configurations can be used in the RAID algorithm such that compromised data portions caused by multi-plane failure, SSG leakage failure, or both can be recovered. In some implementations, a stripe includes data portions distributed in a plurality of layers in memory blocks in a respective plane and in all dies, and a plane temporary parity data portion is determined for each stripe. The stripe does not include data portions in other planes. In case of programming failures detected, e.g., due to multi-plane failure, the plane parity portion of a respective stripe can be used to locate and recover the compromised data portion. In some implementations, a stripe includes data portions distributed in a single layer in memory blocks in all planes and in all dies, and a layer parity data portion is determined for each stripe. The stripe does not include data portions in other layers. A stripe can be formed in each single layer in the memory blocks. In case of programming failures detected, e.g., due to SSG leakage failure, the layer parity portion of a respective stripe can be used to locate and recover the compromised data portion. In some implementations, a stripe includes data portions distributed in a single layer in memory blocks in a single plane and in all dies, and a parity data portion is generated for each stripe. In case of programming failures detected, e.g., due to SSG leakage failure and/or multi-plane failure, the parity portion of a respective stripe can be used to locate and recover the compromised data portion.

FIG. 1A illustrates a schematic diagram of an apparatus 100 in which the provided methods are operated, according to some aspects of the present disclosure. As shown in FIG. 1A, apparatus 100 includes a host processor 104, a Flash memory controller 106, a random-access memory (RAM) 110, and NAND memory 108 on a printed circuit board (PCB) 102. Each one of host processor 104, Flash memory controller 106, NAND memory 108, and RAM 110 is a discrete chip with its own packaging and mounted on PCB 102. Host processor 104 is a specialized processor for performing data processing of NAND memory 108. For example, host processor 104 may include a central processing unit (CPU) and/or a system-on-chip (SoC), such as an application processor. Data is transmitted between host processor 104 and Flash memory controller 106 and between host processor 104 and RAM 110 each through a respective interlink, such as a processor bus. Host processor 104 may thus control the operations of RAM 110 and Flash memory controller 106. NAND memory 108 may include arrays of memory cells that are configured in a RAID. NAND memory 108 is a 3D NAND memory or a 2D NAND memory, which transfers data with Flash memory controller 106 through another interlink. RAM 110 may include any suitable static random-access memory (SRAM) and/or dynamic random-access memory (DRAM).

Flash memory controller 106 can manage the data stored in flash memory (either NAND Flash memory or NOR Flash memory) and communicate with host processor 104. In some implementations, Flash memory controller 106 is designed for operating in a low duty-cycle environment like Secure Digital (SD) cards, Compact Flash (CF) cards, USB Flash drives, or other media for use in electronic devices, such as personal computers, digital cameras, mobile phones, etc. In some implementations, Flash memory controller 106 is designed for operating in a high duty-cycle environment like solid-state drives (SSDs) or embedded Multi-Media-Cards (eMMCs) used as data storage for mobile devices, such as smartphones, tablets, laptop computers, etc., and enterprise storage arrays. Flash memory controller 106 can be configured to control operations of the NAND memory 108, such as read, write, erase, and program operations. Flash memory controller 106 can also be configured to manage various functions with respect to the data stored or to be stored in NAND memory 108 including, but not limited to bad-block management, garbage collection, logical-to-physical address conversion, wear leveling, and so on. In some implementations, Flash memory controller 106 is further configured to process error correction codes (ECCs) with respect to the data read from or written to NAND memory 108. Any other suitable functions may be performed by Flash memory controller 106 as well, for example, formatting the Flash memory.

Figure 1B:
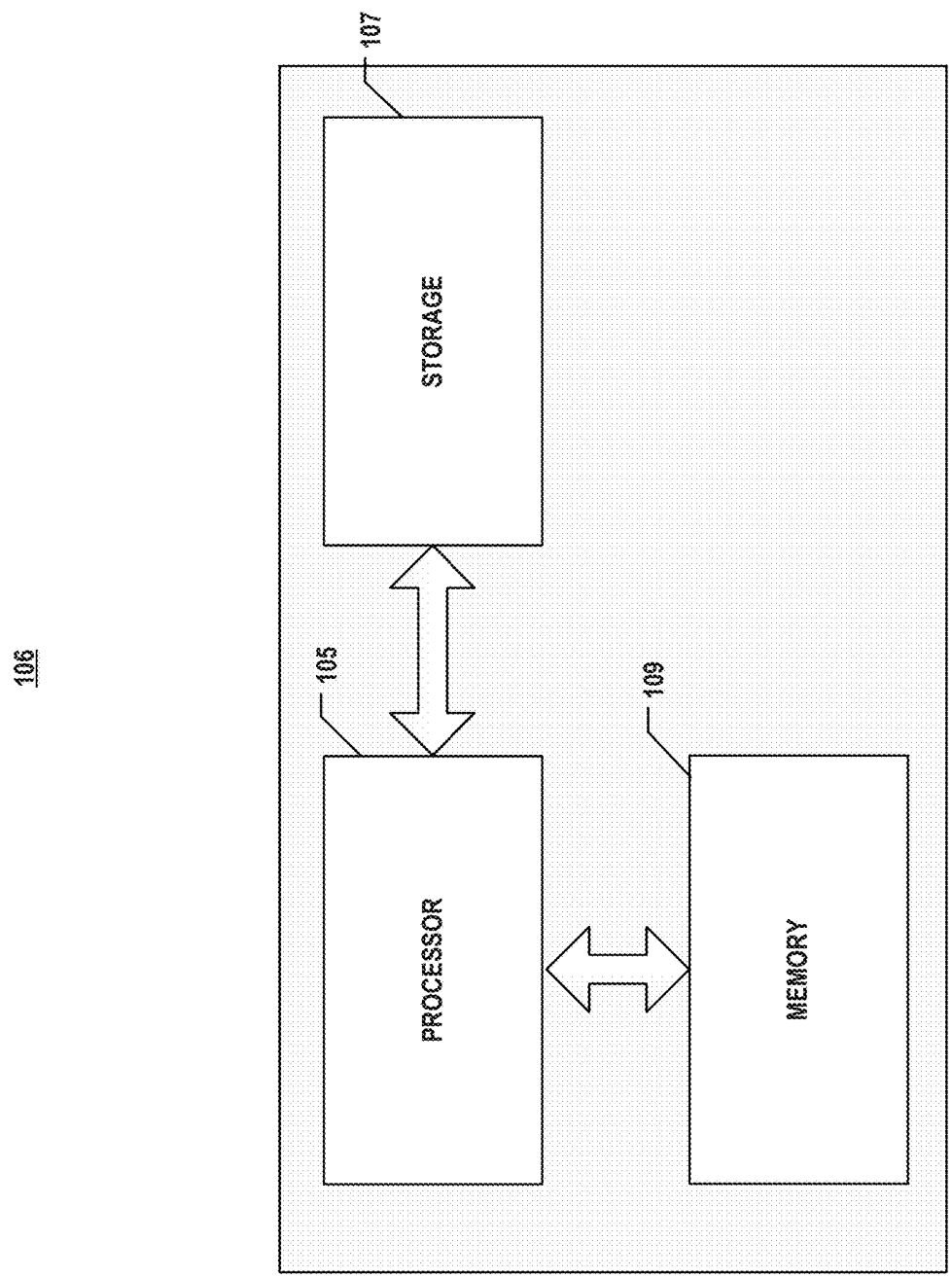
FIG. 1B illustrates a schematic diagram of the Flash memory controller, according to some aspects of the present disclosure.

FIG. 1B illustrates an exemplary implementation of Flash memory controller 106, according to some implementations. Flash memory controller 106 may control the operations of NAND memory 108 by generating control signals to control the striping, computing, and storage of memory data in NAND memory 108. Consistent with the present disclosure, Flash memory controller 106 may receive signals from host processor 104 for the operation of NAND memory 108. In some implementations, Flash memory controller 106 may include a processor 105, a memory 109, and a storage 107. In some embodiments, Flash memory controller 106 may have different modules in a single device, such as an integrated circuit (IC) chip (implemented as, for example, an application-specific integrated circuit (ASIC) or a field-programmable gate array (FPGA)), or separate devices with dedicated functions. In some embodiments, components of Flash memory controller 106 may be in an integrated device, or distributed at different locations but communicate with each other through a network.

Processor 105 may include any appropriate type of general-purpose or special-purpose microprocessor, digital signal processor, or microcontroller. Processor 105 may be configured as a stand-alone processor module dedicated to analyzing signals (e.g., signals from host processor 104) and/or controlling the scan schemes. Alternatively, processor 105 may be configured as a shared processor module for performing other functions unrelated to signal analysis/scan scheme control. Although not shown in FIG. 1B, processor 105 may include multiple functional units or modules that can be implemented using software, hardware, middleware, firmware, or any combination thereof. The multiple functional units may perform striping, computing, and controlling the storage of parity data of the present disclosure based on signals from host processor 104 or any pre-stored control data.

Storage 107 and memory 109 may include any appropriate type of mass storage provided to store any type of information that processor 105 may need to operate. Memory 109 and/or storage 107 may be volatile or non-volatile, magnetic, semiconductor-based, tape-based, optical, removable, non-removable, or other type of storage device or tangible (i.e., non-transitory) computer-readable medium including, but not limited to, a ROM, a flash memory, a dynamic RAM, a static RAM, a hard disk, an SSD, an optical disk, etc. Storage 107 and/or memory 109 may be configured to store one or more computer programs that may be executed by processor 105 to perform functions disclosed herein. For example, memory 109 and/or storage 107 may be configured to store program(s) that may be executed by processor 105 to form RAID stripes, compute parity data, and control the storage of parity data. In some implementations, storage 107 and memory 109 may also be configured to store/cache information and data received and/or used by processor 105. For instance, storage 107 and memory 109 may store/cache data received from host processor 104, and/or data (e.g., temporary parity data) generated during the RAID operation.

Referring back to FIG. 1A, Flash memory controller 106 can include a host interface (I/F) operatively coupled to host processor 104, for example, through a processor bus, and configured to receive the instruction from host processor 104. The host I/F can include a serial attached SCSI (SAS), parallel SCSI, PCI express (PCIe), NVM express (NVMe), advanced host controller interface (AHCI), to name a few. Flash memory controller 106 can also include a management module and a NAND memory interface (I/F). In some implementations, the management module is operatively coupled to the host I/F and the NAND memory I/F and configured to generate one or more control signals to control operations (e.g., read, write, erase, and program operations) of NAND memory 108 based on the instruction received from host processor 104 and send the control signals to the NAND memory I/F. For example, the management module determines stripes in NAND memory 108, and performs computation to determine temporary parity data and recover memory data in stripes. The management module can be any suitable control and state machine. In some implementations, the NAND memory I/F is configured to transmit the control signals to NAND memory 108 and receive the status signals from NAND memory 108. The status signal can indicate the status of each operation performed by NAND memory 108 (e.g., failure, success, delay, etc.), which can be sent back to the management module as feedbacks. The NAND memory I/F can include single data rate (SDR) NAND Flash interface, open NAND Flash interface (ONFI), Toggle double data rate (DDR) interface, to name a few.

NAND memory 108 be a NAND Flash memory having an array of NAND memory cells in the form of an array of 3D NAND memory cells. In some implementations, the array of NAND memory cells is an array of 3D NAND memory cells, formed by the intersections of word lines and memory strings, each of which extends vertically above a substrate through a memory stack. Depending on the 3D NAND technology (e.g., the number of layers/tiers in the memory stack), a memory string typically includes 32 to 256 NAND memory cells, each of which includes a floating-gate transistor or a charge-trapping transistor.

Figure 7:
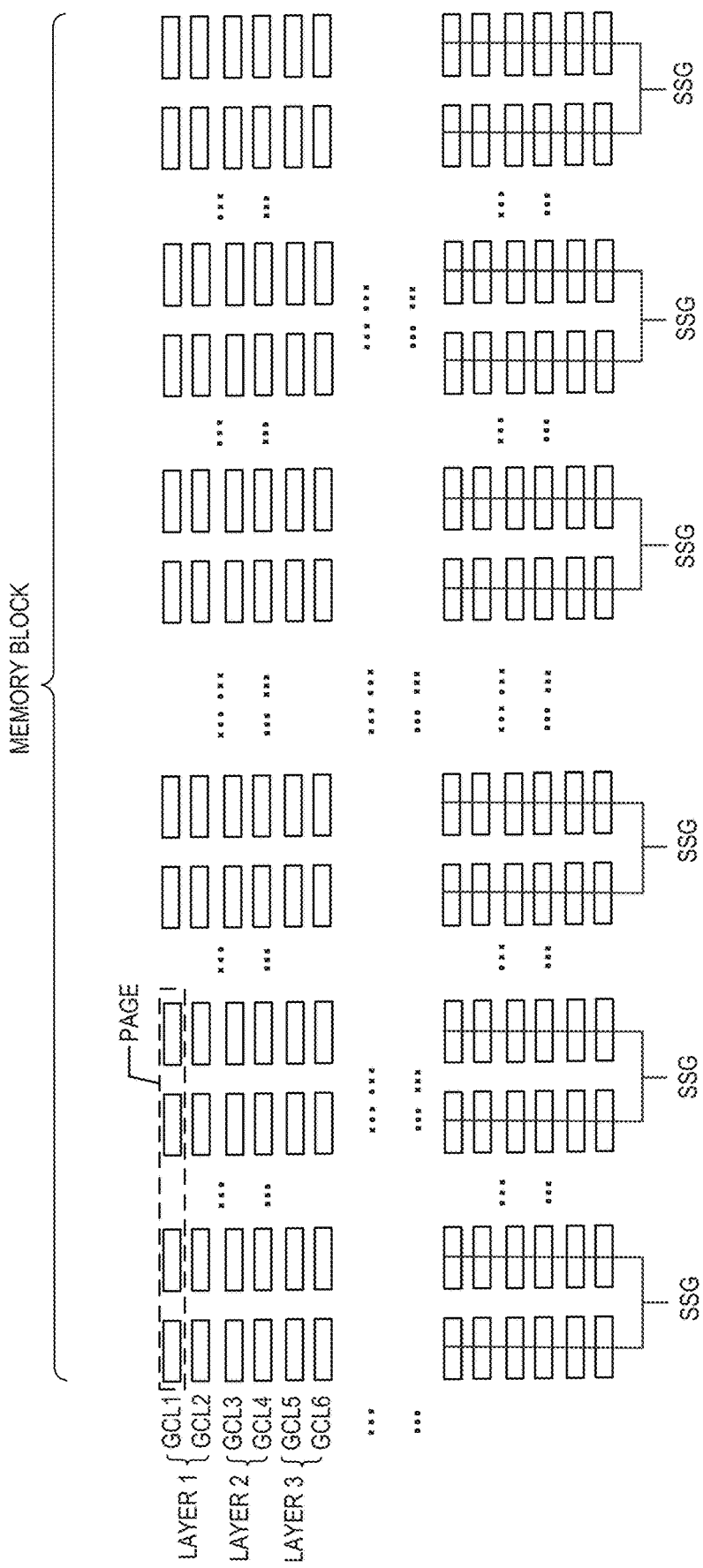
FIG. 7 illustrates a schematic diagram showing certain components of a NAND memory, according to some aspects of the present disclosure.

NAND memory cells can be organized into pages, which are then organized into memory blocks, in which each NAND memory cell is electrically connected to a separate line called a bit line (BL). All cells with the same position in the NAND memory cell can be electrically connected through the control gates by a word line (WL), i.e., a conductive gate layer. Each word line may be electrically coupled with the control gates of memory cells in a plurality of pages. In some implementations, a plane contains a certain number of memory blocks that are electrically connected through the same bit line. FIG. 7 illustrates a schematic diagram of a cross-sectional view of NAND memory 108 in a memory block in a lateral direction, according to some implementations. As shown in FIG. 7, a plurality of gate conductive layers, i.e., GCL1, GCL2, . . . , are arranged in a memory block in the vertical direction. Each of the gate conductive layers extend laterally. Memory cells formed by a single gate conductive layer and memory strings form a page. Each gate conductive layer, in one memory block, can be coupled to memory cells of multiple pages. That is, one memory block can include multiple pages on a single level. Two adjacent gate conductive layers form a layer, defined in the present disclosure. For example, GCL1 and GCL2 form layer 1, GCL3 and GCL4 form layer 2, etc. SSGs can each be electrically coupled to a plurality of gate conductive layers (e.g., a plurality of memory cells) in the vertical direction. In some implementations, NAND memory 108 includes multiple dies, each having at least one plane. Examples of NAND memory 108 are illustrated in detail in FIGS. 2, 3A and 3B, and 4A-4C and the related descriptions.

Host processor 104 may coordinate operations in different modules/parts in apparatus 100 based on data and/or signals transmitted from Flash memory controller 106. Host processor 104 may control the operation of RAM 110 based on data and/or signals transmitted from Flash memory controller 106. For example, host processor 104 may receive temporary parity data from Flash memory controller 106 and store the temporary parity data in RAM 110 for computation and/or reference. Host processor 104 may also remove the temporary parity data from RAM 110 when the temporary parity data is no longer needed.

In another example (not shown), the chips of Flash memory controller 106 and NAND memory 108 may be included in the same package, such as a universal Flash storage (UFS) package or an eMMC package, and electrically connected through wire bonding. Flash memory controller 106 then may transfer data with host processor 104 through an interlink, such as a processor bus, which is driven by a software driver, such as a UFS driver software or an MMC driver software.

In some implementations, apparatus 100 also includes a peripheral circuit (not shown, also known as the control and sensing circuits) that includes any suitable digital, analog, and/or mixed-signal circuits used for facilitating the operations of NAND memory 108. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

RAID algorithm may be performed on the memory data of NAND memory 108, configured into a plurality of stripes, to create data redundancy. A stripe may include a plurality of data portions, distributed in desired physical locations (e.g., pages, memory blocks, etc.) of NAND memory 108. Temporary parity data can be generated for detecting and/or recovering compromised memory data of a respective stripe. Optionally, the temporary parity data can be retained or removed. Overall parity data may be generated for the memory data in all the stripes. FIGS. 2, 3A and 3B, and 4A-4C illustrate three different striping configurations in respective NAND memories and corresponding RAID algorithm, according to some implementations. FIGS. 5A-5D illustrate temporary parity data storage for respective RAID algorithm, according to some aspects of the present disclosure. FIGS. 6A-6C each illustrates a flowchart of a method for striping and performing data recovery using RAID algorithm in a respective striping configuration, according to some aspects of the present disclosure. It is understood that the operations shown in methods 600, 620, and 640 are not exhaustive and that other operations can be performed as well before, after, or between any of the illustrated operations. Further, some of the operations may be performed simultaneously, or in a different order than shown in FIGS. 6A-6C.

NAND memories 200, 300, and 400 in FIGS. 2, 3A and 3B, and 4A-4C are each an example of NAND memory 108 in FIG. 1A. The operations on NAND memories 200, 300, and 400 may be controlled by a Flash memory controller, e.g., Flash memory controller 106. For ease of illustration, NAND memories 200, 300, and 400 may each include N dies (e.g., $DIE_1$, $DIE_2$, ..., $DIE_N$), where N is a positive integer of at least 1. Each die may be laterally divided into M planes (e.g., $PLN_1$, $PLN_2$, ..., $PLN_M$), M being a positive integer of at least 1. In some implementations, M is equal to or greater than 2. In some implementations, M is greater than or equal to 4, such as 6 or 8. Each plane may be laterally divided into X memory blocks ($B_1$, $B_2$, ..., $B_X$), X being a positive integer of at least 1. Each memory block may include a plurality of memory cells formed by the intersections of a number of gate conductive layers (e.g., extending laterally) and a plurality of memory strings (e.g., extending vertically). The number of gate conductive layers, arranged vertically, in each memory block may be equal to or greater than 2. In some implementations, gate conductive layers of the same level in adjacent memory blocks may be in contact with each other. Each memory block may be laterally divided into a plurality of pages. Memory data may be stored in the memory cells in pages, memory blocks, planes, and dies. In some implementations, M is equal to 4. In some implementations, N is equal to 4. In some implementations, the number of gate conductive layers in a memory block is equal to or greater than 16.

Figure 2:
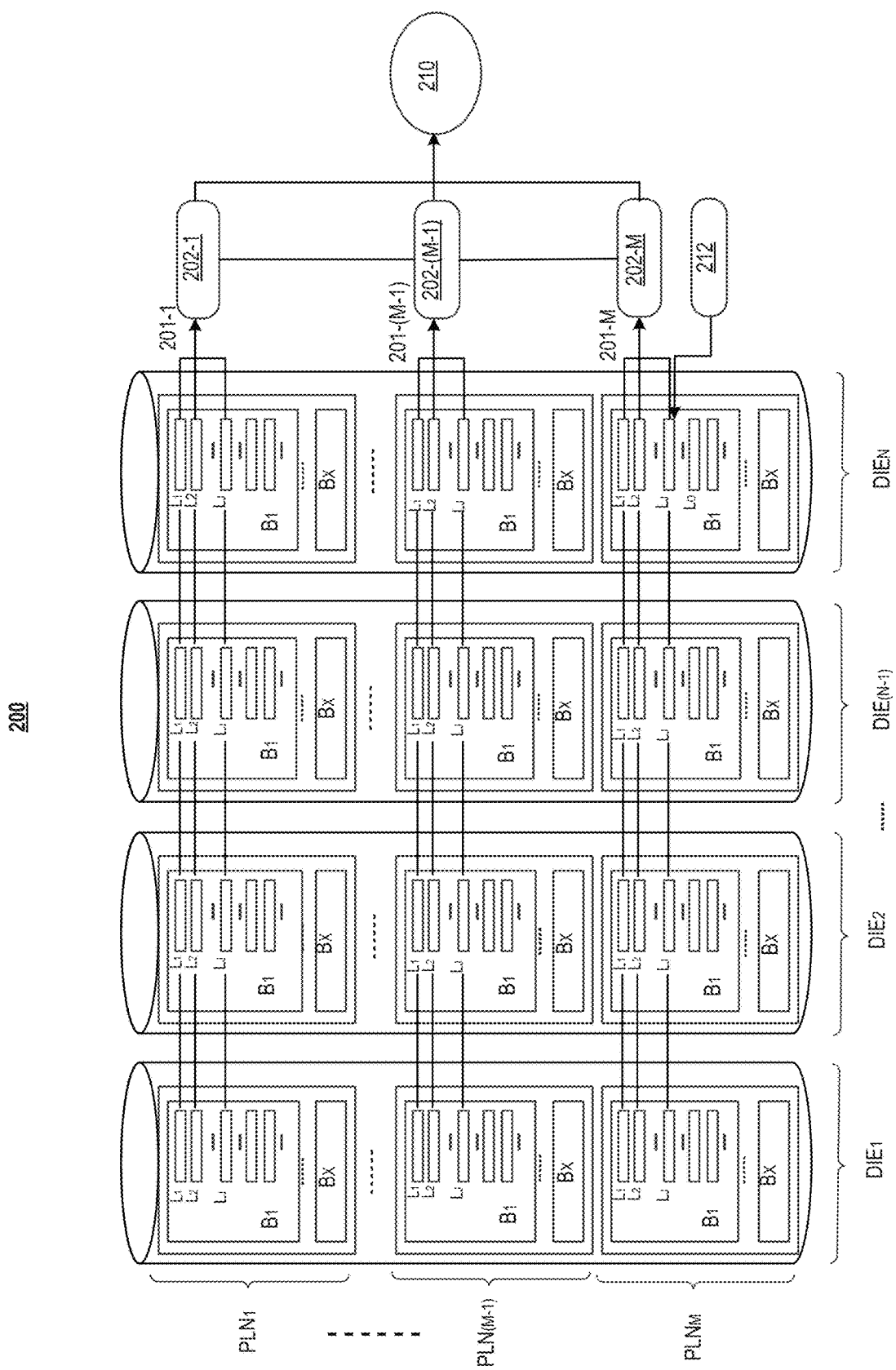
FIG. 2 is a schematic diagram of an exemplary striping configuration for a RAID algorithm in a NAND memory, according to some aspects of the present disclosure.
Figure 5A:
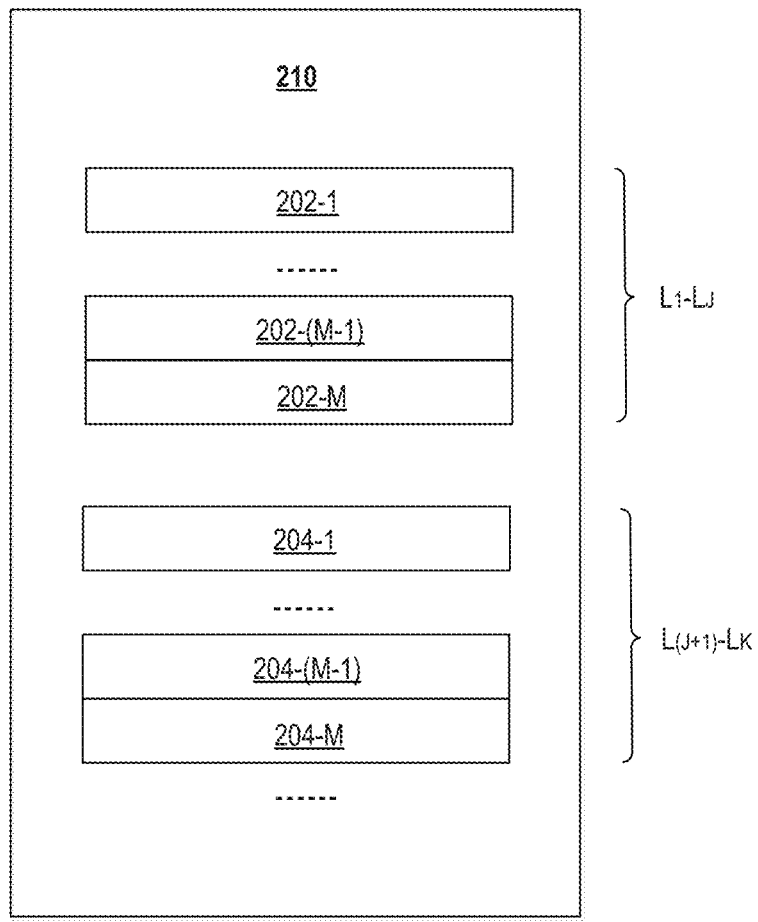
FIG. 5A illustrates exemplary parity data storage, generated in the method in FIG. 2, according to some aspects of the present disclosure.
Figure 6A:
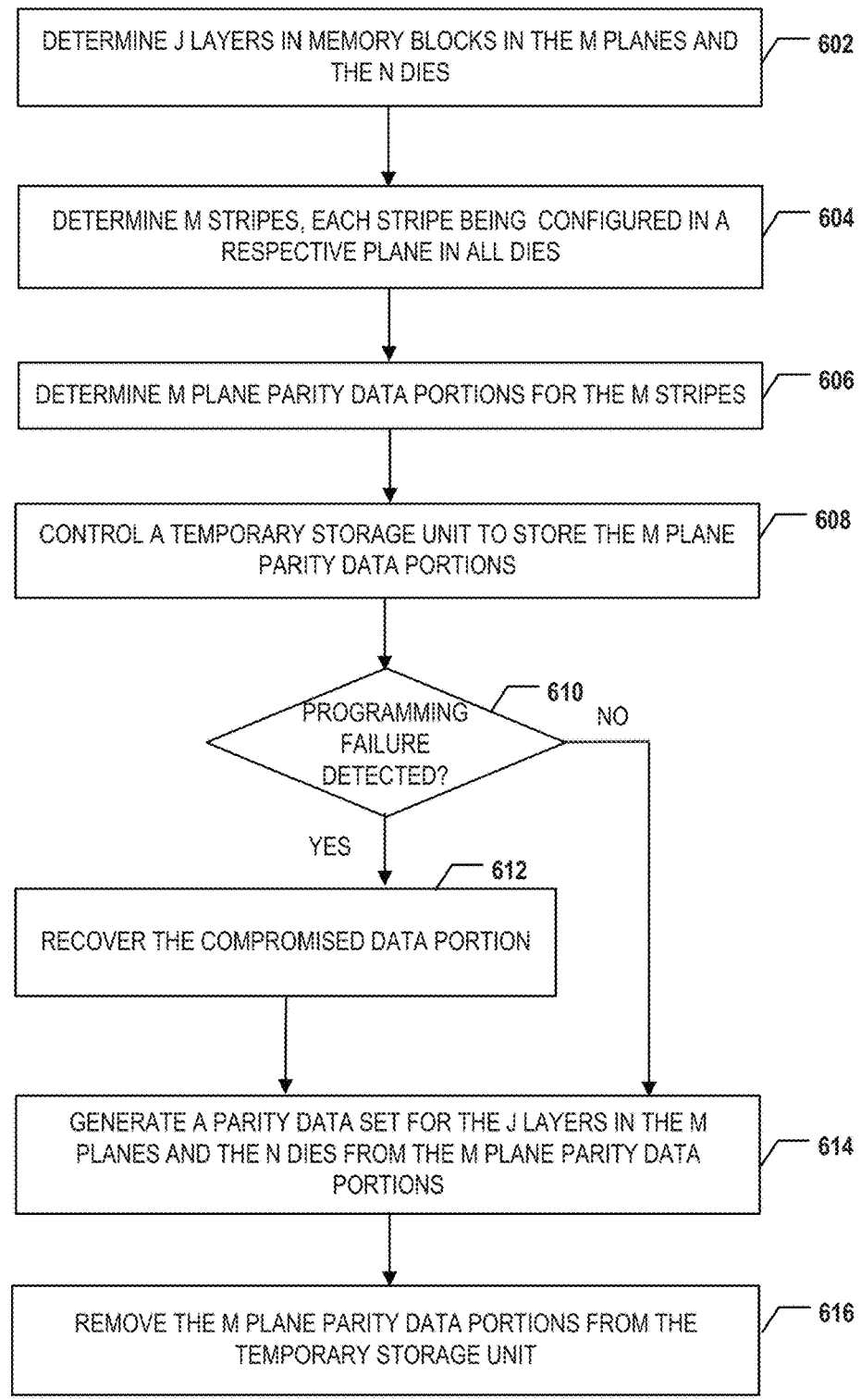
FIG. 6A illustrates a flowchart of a method for operating the NAND memory in FIG. 2, according to some aspects of the present disclosure.
Figure 6B:
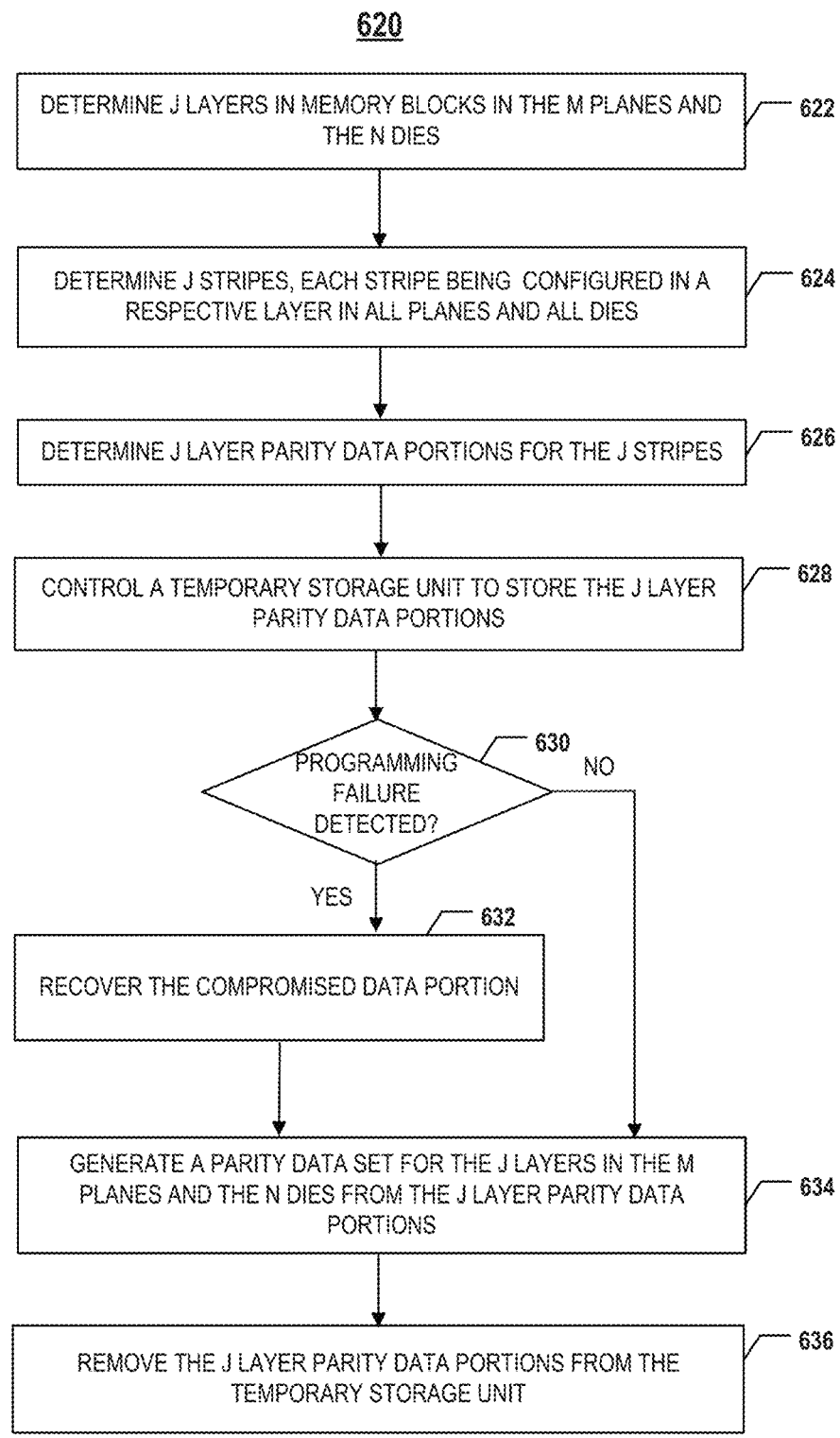
FIG. 6B illustrates a flowchart of a method for operating the NAND memory in FIGS. 3A and 3B, according to some aspects of the present disclosure.
Figure 6C:
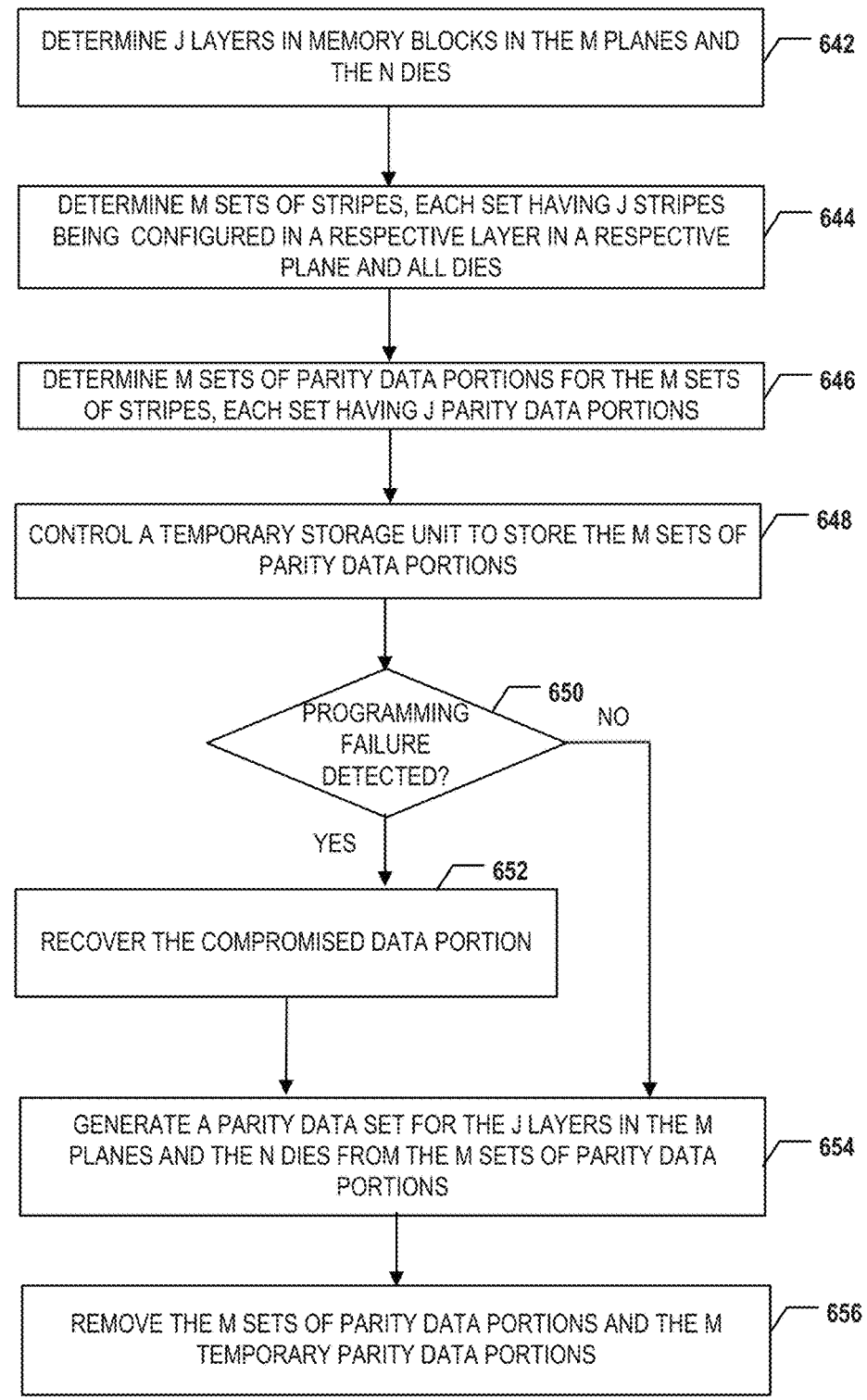
FIG. 6C illustrates a flowchart of a method for operating the NAND memory in FIGS. 4A-4C, according to some aspects of the present disclosure.

FIG. 2 illustrates a striping configuration for a RAID algorithm employed in NAND memory 200, and FIG. 5A illustrates a temporary storage unit 210 employed for storing temporary parity data generated according to the RAID algorithm, according to some aspects of the present disclosure. The RAID algorithm can be a RAID 5. In some implementations, the striping in NAND memory 200 can be used to recover memory data in a multi-plane failure. FIGS. 2, 5A, and 6A are described together.

Referring to FIG. 6A, method 600 starts at operation 602, in which J layers are determined in each memory block in the M planes and the N dies, where J is a positive integer of at least 2. Each layer includes a pair of adjacent gate conductive layers. FIG. 2 illustrates a corresponding configuration for method 600.

As shown in FIG. 2, in memory block $B_1$ of each plane (e.g., $PLN_1$, $PLN_2$, ..., $PLN_M$), J layers, $L_1$, $L_2$, ..., $L_J$, may be determined in each die $DIE_1$, $DIE_2$, ..., $DIE_N$. Each layer may include a pair of adjacent gate conductive layers. In some implementations, memory block B1 includes at least 16 gate conductive layers, and J is equal to or greater than 8. Flash memory controller 106 may perform this operation.

Referring back to FIG. 6A, method 600 proceeds to operation 604, in which M stripes are determined, each stripe being configured in a respective plane.

As shown in FIG. 2, M stripes, 201-1, 201-2, ..., 201-(M−1), and 201-M, may be determined. Each of the M stripes may correspond to a respective plane and may include J×N data portions that are stored in the J layers in a respective plane in all N dies. Each data portion may include memory data stored in the memory cells formed by the intersections of the respective layer (i.e., the pair of adjacent gate conductive layers) in the respective memory block and the memory strings in the memory block. For example, stripe 201-1 may correspond to plane $PLN_1$, and may include J×N data portions stored in the J layers in memory blocks $B_1$ in the N dies (i.e., $DIE_1$-$DIE_N$), and stripe 201-M may correspond to plane $PLN_M$, and may include J×N data portions stored in the J layers in memory blocks $B_1$ in the N dies (i.e., $DIE_1$-$DIE_N$). Each data portion in stripe 201-1 includes the memory data stored in the memory cells formed by the two gate conductive layers in layer $L_1$ and the memory strings in the respective memory blocks $B_1$ in $PLN_1$. In other words, memory data stored in layer $L_1$ in memory block $B_1$ of plane $PLN_1$ in die $DIE_1$ may form a first data portion of stripe 201-1, memory data stored in layer $L_1$ in memory block $B_1$ of plane $PLN_1$ in die $DIE_2$ may form a second data portion of stripe 201-1, ..., memory data stored in layer $L_J$ in memory block $B_1$ of plane $PLN_1$ in die $DIE_1$ may form a $(J \times N-(N-1))^t$ data portion of stripe 201-1, ..., and memory data stored in layer $L_J$ in memory block $B_1$ of plane $PLN_1$ in die $DIE_N$ may form a $(J \times N)^{th}$ data portion of stripe 201-1. In some implementations, Flash memory controller 106 may perform this operation.

As shown in FIG. 2, the M stripes 201-1, 201-2, ..., 201-(M−1), and 201-M are each configured in the respective plane, and does not include data portions in another plane. That is, the data portions of each stripe are configured only in the respective plane and are not in another plane, e.g., not "across planes." The striping configuration may ensure that the programming failure occurs in the parallel programming of multiple planes does not impact more than one data portion in a single stripe. That is, the multi-plane failure can result in at most one compromised data portion in a single stripe. Thus, more than one compromised data portion in a stripe, caused by multi-plane failure, can be avoided. The compromised data portion can thus be recovered using the temporary parity data of the stripe. Details are provided below.

Referring back to FIG. 6A, method 600 proceeds to operation 606, in which M plane data portions are determined for the M stripes.

As shown in FIG. 2, M plane parity data portions, 202-1, 202-2, ..., 202-(M−1), 202-M, may be determined for the M stripes. Each of the plane parity data portions may be generated based on the data portions of the respective stripe. In some implementations, an exclusive or (XOR) operation is performed amongst the J×N data portions of each stripe to generate the respective plane parity data portion. For example, plane parity data portion 202-1 may be the result of the XOR operation on all J×N data portions in stripe 201-1, plane parity data portion 202-2 may be the result of the XOR operation on all J×N data portions in stripe 201-2, . . . , plane parity data portion 202-(M−1) may be the result of the XOR operation on all J×N data portions in stripe 201-(M−1), and plane parity data portion 202-M may be the result of the XOR operation on all J×N data portions in stripe 201-M. In some implementations, Flash memory controller 106 may perform this operation.

Referring back to FIG. 6A, method 600 proceeds to operation 608, in which a temporary storage unit is controlled to store the M plane parity data portions.

As shown in FIG. 2, a temporary storage unit 210 may be controlled to store each of the M plane parity data portions 202-1, 202-2, . . . , 202-(M−1), 202-M. FIG. 5A illustrates a diagram of the temporary storage unit 210 in which the M plane parity data portions are stored. Temporary storage unit 210 may be a storage space in any suitable medium that allows the M plane parity data portions to be stored for a desirable amount of time. In various implementations, temporary storage unit 210 may be a partition in RAM 110 and/or a dedicated storage space in NAND memory 108. In some implementations, temporary storage unit 210 may be in memory 109 and/or storage 107. In some implementations, temporary storage unit 210 may be an external storage space coupled to apparatus 100. In some implementations, temporary storage unit 210 is located in RAM 110. In some implementations, the duration for which the M plane parity data portions are stored is sufficiently long for Flash memory controller 106 to identify any programming failure, locate the compromised data portion, and use the respective plane parity data portion to recover the compromised data portion. In some implementations, the M plane parity data portions are removed after the recovery operation is completed or no programming failure is detected. In some other implementations, the M plane parity data portions are retained. In some implementations, Flash memory controller 106 may perform this operation.

Referring back to FIG. 6A, method 600 proceeds to operation 610, in which any programming failure due to multi-plane failure is being detected. If a programming failure is detected, method 600 proceeds to operation 612, in which the memory data stored in the compromised data portion in which the multi-plane failure occurred is recovered using the respective plane parity data portion. After the recovery of the compromised data portion, method 600 proceeds to operation 614, in which a parity data set is generated from the M plane parity data portions. If no programming failure is detected, method 600 proceeds to operation 614.

Flash memory controller 106 may determine whether any multi-plane failure occurs during the parallel programming of planes $PLN_1$-$PLN_M$. As previously explained, the multi-plane failure due to parallel programming of multiple planes may cause the memory data in memory cells at the same location of these planes to be compromised. As a result, data portions at the same location of one or more stripes (i.e., 202-1, . . . , 202-M) can be compromised. In some implementations, Flash memory controller 106 may use the plane parity data portion of each stripe to determine whether any multi-plane failure occurred in a data portion in the respective stripe. In some implementations, Flash memory controller 106 may perform an XOR operation amongst the data portions of the respective stripe and the plane parity data portion of the respective stripe to detect and identify the compromised data portion. The location of the compromised data portion in each (if any) stripe may be determined.

If a compromised data portion is detected in a stripe, Flash memory controller 106 may generate a replacement data portion based on the rest of the data portions (e.g., the data portions that are not compromised) in the stripe and the plane parity data portion of the stripe to generate the replacement data portion. In some implementations, the generation of the replacement data portion includes performing an XOR operation amongst the rest of the data portions in the stripe and the plane parity data portion of the stripe. Flash memory controller 106 may recover the compromised data portion with the replacement data portion such that the memory data in the compromised data portion can be retained. In some implementations, Flash memory controller 106 may access the plane parity data portions from temporary storage unit 210 if computation is needed, e.g., for identifying and locating a compromised data portion and/or generating a replacement data portion.

A parity data set 212 that represents the parity/redundancy data of the J layers in memory block B1 in the M planes and N dies, e.g., the J×N×M data portions, may be generated from the M plane parity data portions. In some implementations, parity data set 212 is obtained by performing an XOR operation amongst the M plane parity data portions. Parity data set 212 may be stored in a permanent storage unit (e.g., a plurality of memory cells) in NAND memory 200. In some implementations, parity data set 212 may be stored in a data portion in stripe 201-M. Flash memory controller 106 may perform this operation.

In some implementations, Flash memory controller 106 may continue to perform operations 602-616 for the remaining layers in memory block B1 in the M planes and N dies. For example, plane parity data portions 204-1, . . . , 204-M, corresponding to layers $L_{(J+1)}$ to $L_K$ of memory block B1, may be stored in temporary storage unit 210 for computation and/or reference, as shown in FIG. 5A. The same operations may also be performed for other memory blocks in the M planes and the N dies.

Referring back to FIG. 6A, method 600 proceeds to operation 616, in which the M plane parity data portions are removed from the temporary storage unit.

In some implementations, after the recovery of the compromised data portion(s), Flash memory controller 106 may remove the M plane parity data portions from temporary storage unit 210. In some implementations, if no programming failure is detected, Flash memory controller 106 removes the M plane parity data portions from temporary storage unit 210. By recovering compromised data portion(s) in different planes using respective plane parity data portions, more than one compromised data portion at the same location in different planes, caused by the multi-plane failure, can be recovered. Compared with a RAID method in which one stripe includes data portions across the planes, the number of data portions that can be recovered/protected in these planes is increased, e.g., to more than 1.

Figure 3A:
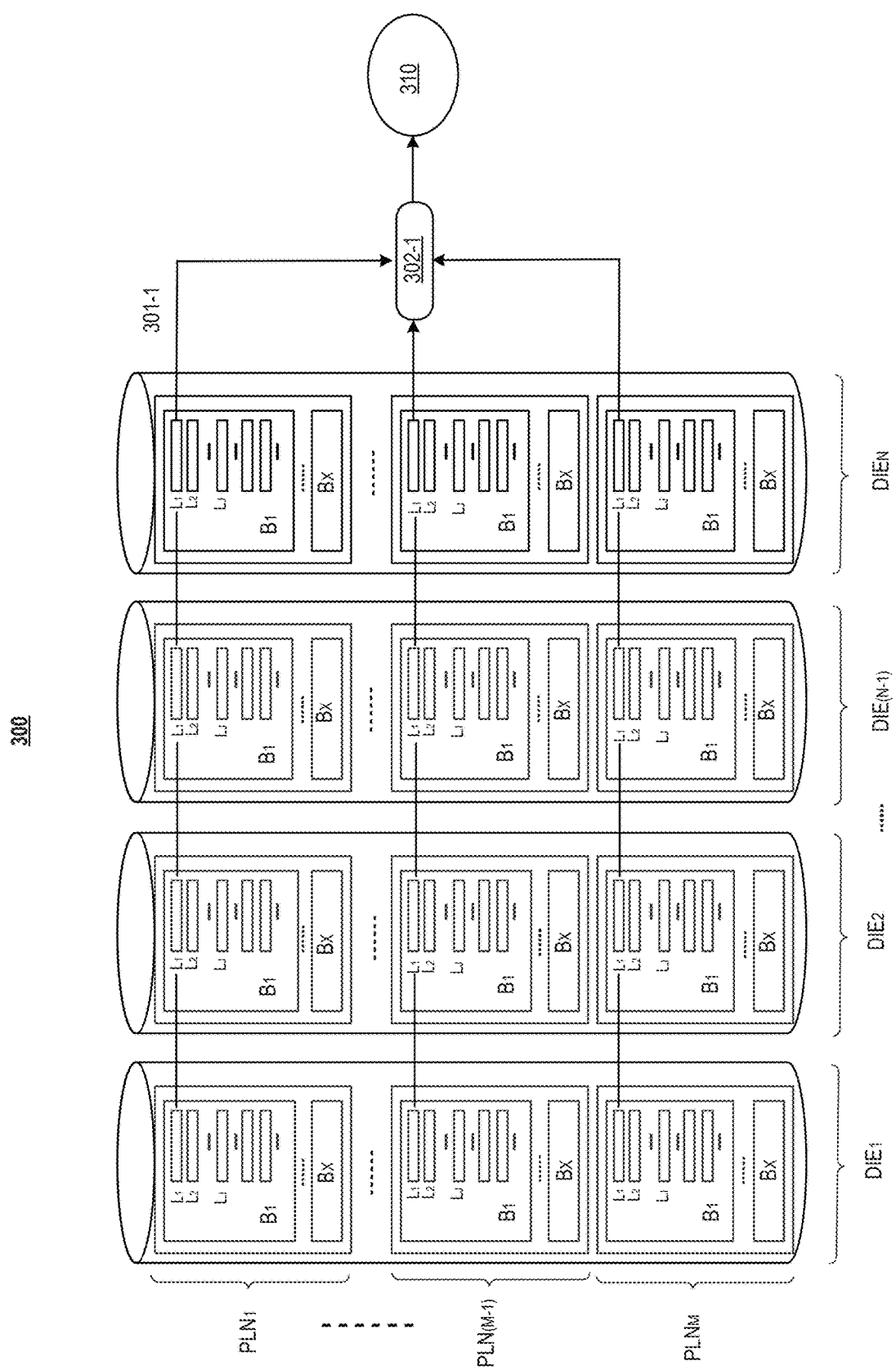
FIGS. 3A and 3B are schematic diagrams of another exemplary striping configuration for a RAID algorithm in a NAND memory, according to some aspects of the present disclosure.
Figure 3B:
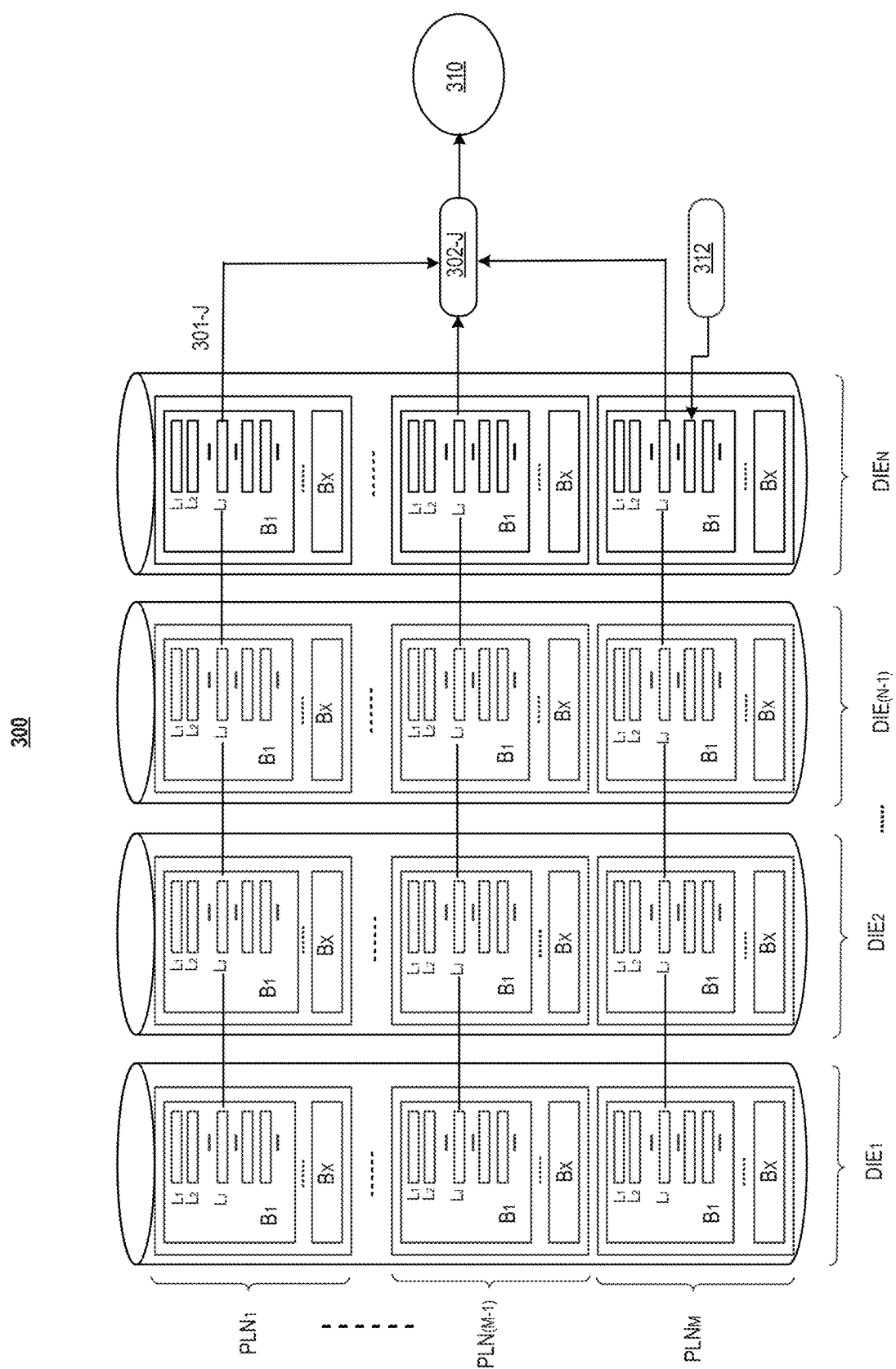
Figure 5B:
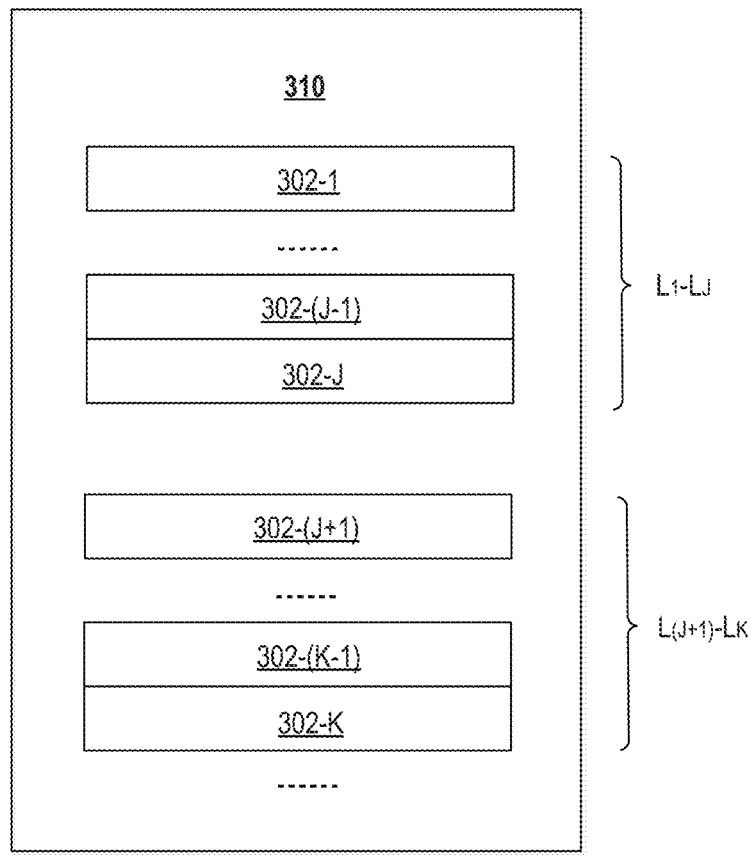
FIG. 5B illustrates exemplary parity data storage generated in the method in FIGS. 3A and 3B, according to some aspects of the present disclosure.

FIGS. 3A and 3B illustrate a striping configuration for a RAID algorithm employed in NAND memory 300, and FIG. 5B illustrates a temporary storage unit 310 employed for storing temporary parity data generated according to the RAID algorithm, according to some aspects of the present disclosure. The RAID algorithm can be a RAID 5. In some implementations, the striping in NAND memory 300 can be used to recover memory data in an SSG leakage failure. FIGS. 3A, 3B, 5B, and 6B are described together.

Referring to FIG. 6B, method 620 starts at operation 622, in which J layers are determined in memory blocks in the M planes and the N dies, J being a positive integer of at least 2. Each layer includes a pair of adjacent gate conductive layers. FIGS. 3A and 3B illustrate a corresponding configuration for method 620. Flash memory controller 106 may perform this operation. This operation can be similar or the same as operation 602, and the detailed description is not repeated herein.

Referring back to FIG. 6B, method 620 proceeds to operation 624, in which J stripes are determined, each stripe being configured in a single layer in the M planes and N dies.

As shown in FIGS. 3A and 3B, J stripes, 301-1, 301-2, ..., 301-(J−1), and 301-J, may be determined. Each of the J stripes may correspond to a respective one of the J layers. Each of the J stripes may include M×N data portions that are stored in the respective single layer in all planes and all dies. Each data portion may include memory data stored in the memory cells formed by the intersections of the respective layer (i.e., the pair of adjacent gate conductive layers) in the respective memory block and the memory strings in the memory block. For example, stripe 301-1 may correspond to layer $L_1$, and may include M×N data portions stored in layer $L_1$ in memory block $B_1$ in the M planes (i.e., $PLN_1$-$PLN_M$) and the N dies (i.e., $DIE_1$-$DIE_N$), and stripe 301-J may correspond to layer $L_J$, and may include M×N data portions stored in layer $L_J$ in memory block $B_1$ the M planes and the N dies. Each data portion in stripe 301-1 includes the memory data stored in the memory cells formed by the two gate conductive layers and the memory strings in the respective memory block B1 in the M planes and the N dies. In other words, memory data stored in layer $L_1$ in memory block $B_1$ of plane $PLN_1$ in die $DIE_1$ may form a first data portion of stripe 301-1, memory data stored in layer $L_1$ in memory block $B_1$ of plane $PLN_2$ in die $DIE_1$ may form a $(N+1)^{th}$ data portion of stripe 301-1, ..., memory data stored in layer $L_1$ in memory block $B_1$ of plane $PLN_M$ in die $DIE_1$ may form an $(M \times N-(N-1))^{th}$ data portion of stripe 301-1, ..., and memory data stored in layer $L_1$ in memory block $B_1$ of plane $PLN_M$ in die $DIE_N$ may form a $(M \times N)^{th}$ data portion of stripe 301-1. In some implementations, Flash memory controller 106 may perform this operation.

As shown in FIGS. 3A and 3B, the J stripes 301-1, 301-2, ..., 301-(J−1), and 301-J are each configured in the respective layer, and are not configured in another layer. That is, each of the J stripes includes data portions in only in a single layer in the memory blocks and does not include data portions in another layer, e.g., not "across layers." The striping configuration may ensure that SSG leakage failure does not cause more than one compromised data portions in a single stripe. The SSG leakage failure can at most cause compromised data portions in different layers, each in a different stripe. Thus, more than two compromised data portions in a single stripe, caused by SSG leakage failure, can be avoided. The compromised data portion can each be recovered using the parity data of the stripe. Details are provided below.

Referring back to FIG. 6B, method 620 proceeds to operation 626, in which J layer parity data portions are determined for the J stripes.

As shown in FIGS. 3A and 3B, J layer parity data portions, 302-1, 302-2, ..., 302-(J−1), 302-J, may be determined for the J stripes. Each of the layer parity data portions may be generated based on the data portions of the respective stripe. In some implementations, an exclusive or (XOR) operation is performed amongst the M×N data portions of each stripe to generate the respective layer parity data portion. For example, layer parity data portion 302-1 may be the result of the XOR operation on all M×N data portions of stripe 301-1, layer parity data portion 302-2 may be the result of the XOR operation on all M×N data portions of stripe 301-2, ..., layer parity data portion 302-(J−1) may be the result of the XOR operation on all M×N data portions of stripe 301-(J−1), and layer parity data portion 302-J may be the result of the XOR operation on all M×N data portions of stripe 301-J. In some implementations, Flash memory controller 106 may perform this operation.

Referring back to FIG. 6B, method 620 proceeds to operation 628, in which a temporary storage unit is controlled to store the J layer parity data portions.

As shown in FIGS. 3A and 3B, a temporary storage unit 310 may be controlled to store each of the J layer parity data portions 302-1, 302-2, ..., 302-(J−1), 302-J. FIG. 5B illustrates a diagram of the temporary storage unit 310 in which the J layer parity data portions are stored. Temporary storage unit 310 may be a storage space in any suitable medium that allows the J layer parity data portions to be stored for a desirable amount of time. In various implementations, temporary storage unit 310 may be a partition in RAM 110 and/or a dedicated storage space in NAND memory 108. In some implementations, temporary storage unit 310 may be an external storage space coupled to apparatus 100. In some implementations, temporary storage unit 310 is located in RAM 110. In some implementations, the duration for which the J layer parity data portions are stored is sufficiently long for Flash memory controller 106 to identify any programming failure, locate the compromised data portion, and use the respective layer parity data portion to recover the compromised data portion. In some implementations, the J layer parity data portions are removed after the recovery operation is completed or no programming failure is detected. In some other implementations, the J layer parity data portions are retained. In some implementations, Flash memory controller 106 may perform this operation.

Referring back to FIG. 6B, method 620 proceeds to operation 630, in which any programming failure, e.g., due to SSG leakage failure, is being detected. If a programming failure is detected, method 620 proceeds to operation 632, in which the memory data stored in the compromised data portion in which the programming failure occurred is recovered using the respective layer parity data portion. After the recovery of the compromised data portion, method 620 proceeds to operation 634, in which a parity data set is generated from the J layer parity data portions. If no programming failure is detected, method 620 proceeds to operation 634.

Flash memory controller 106 may determine whether any programming failure due to SSG leakage failure occurred. As previously explained, the programming failure due to SSG leakage failure may cause the memory data in memory cells at the same location of different levels to be compromised. However, the striping illustrated in FIGS. 3A and 3B can ensure only a single data portion, if any, in a stripe can be compromised due to SSG leakage failure. The SSG leakage failure can at most cause data portions in different stripes to be compromised. In some implementations, Flash memory controller 106 may use the layer parity data portion of each stripe to determine whether any programming failure occurred in a data portion in the respective stripe. In some implementations, Flash memory controller 106 may perform an XOR operation amongst the data portions of the respective stripe and the layer parity data portion of the respective stripe to detect and identify the compromised data portion. The location of the compromised data portion in each (if any) stripe may be determined.

If a compromised data portion is detected in a stripe, Flash memory controller 106 may generate a replacement data portion based on the rest of the data portions (e.g., the data portions that are not compromised) in the stripe and the layer parity data portion of the stripe to generate the replacement data portion. In some implementations, the generation of the replacement data portion includes performing an XOR operation amongst the rest of the data portions in the stripe and the layer parity data portion of the stripe. Flash memory controller 106 may recover the compromised data portion with the replacement data portion such that the memory data in the compromised data portion can be retained. In some implementations, Flash memory controller 106 may obtain the layer parity data portions from temporary storage unit 310 if computation is needed, e.g., for identifying and locating a compromised data portion and/or generating a replacement data portion.

A parity data set 312 that represents the parity/redundancy data of the J layers in memory block B1 in the M planes and N dies, e.g., the J×N×M data portions, may be generated from the J layer parity data portions. In some implementations, parity data set 312 is obtained by performing an XOR operation amongst the J layer parity data portions. Parity data set 312 may be stored in a permanent storage unit (e.g., a plurality of memory cells) in NAND memory 300. Flash memory controller 106 may perform this operation.

In some implementations, Flash memory controller 106 may continue to perform operations 622-636 for the remaining layers in memory block B1 in the M planes and N dies. For example, layer parity data portions 302-(J+1), . . . , 302-(K−1), 302-K, corresponding to layers $L_{(J+1)}$ to $L_K$ of memory blocks B1, may be stored in temporary storage unit 210 for computation and/or reference. The same operations may also be performed for other memory blocks in the M planes and the N dies.

Referring back to FIG. 6B, method 620 proceeds to operation 636, in which the J layer parity data portions are removed from the temporary storage unit.

In some implementations, after the recovery of the compromised data portion(s) and the generation of the parity data set, Flash memory controller 106 may remove the J layer parity data portions from temporary storage unit 310. In some implementations, if no programming failure is detected, Flash memory controller 106 removes the J layer parity data portions from temporary storage unit 310. By recovering compromised data portion(s) in different layers using respective layer parity data portions, more than one compromised data portions, caused by the programming failure due to SSG leakage failure at the same location in more than one layers, can be recovered. Compared with a RAID method in which one stripe includes data portions across the layers, the number of data portions that can be recovered/protected in these layers is increased, e.g., to more than 1.

Figure 4A:
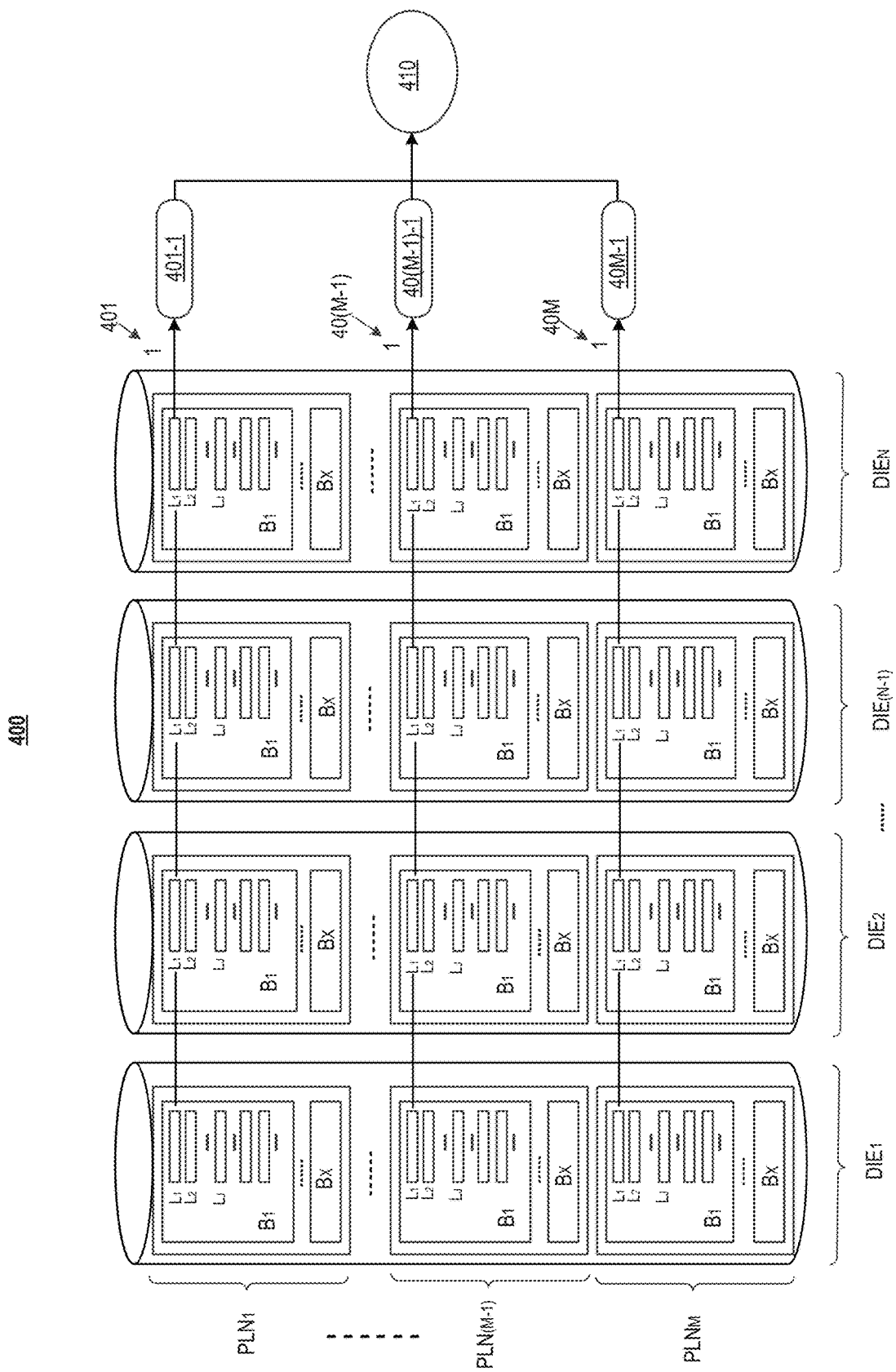
FIGS. 4A-4C are schematic diagrams of another exemplary striping configuration for a RAID algorithm in a NAND memory, according to some aspects of the present disclosure.
Figure 4B:
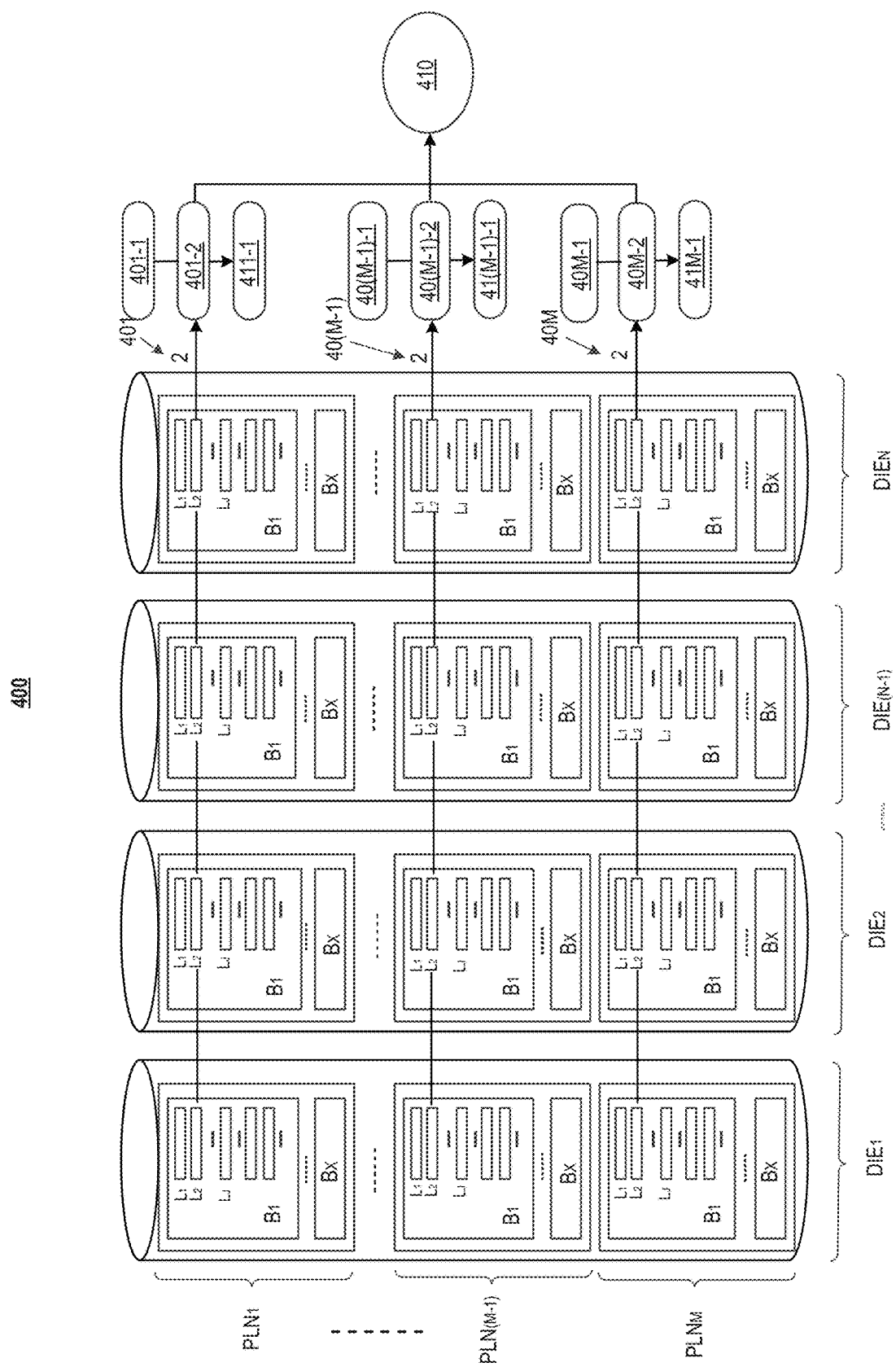
Figure 4C:
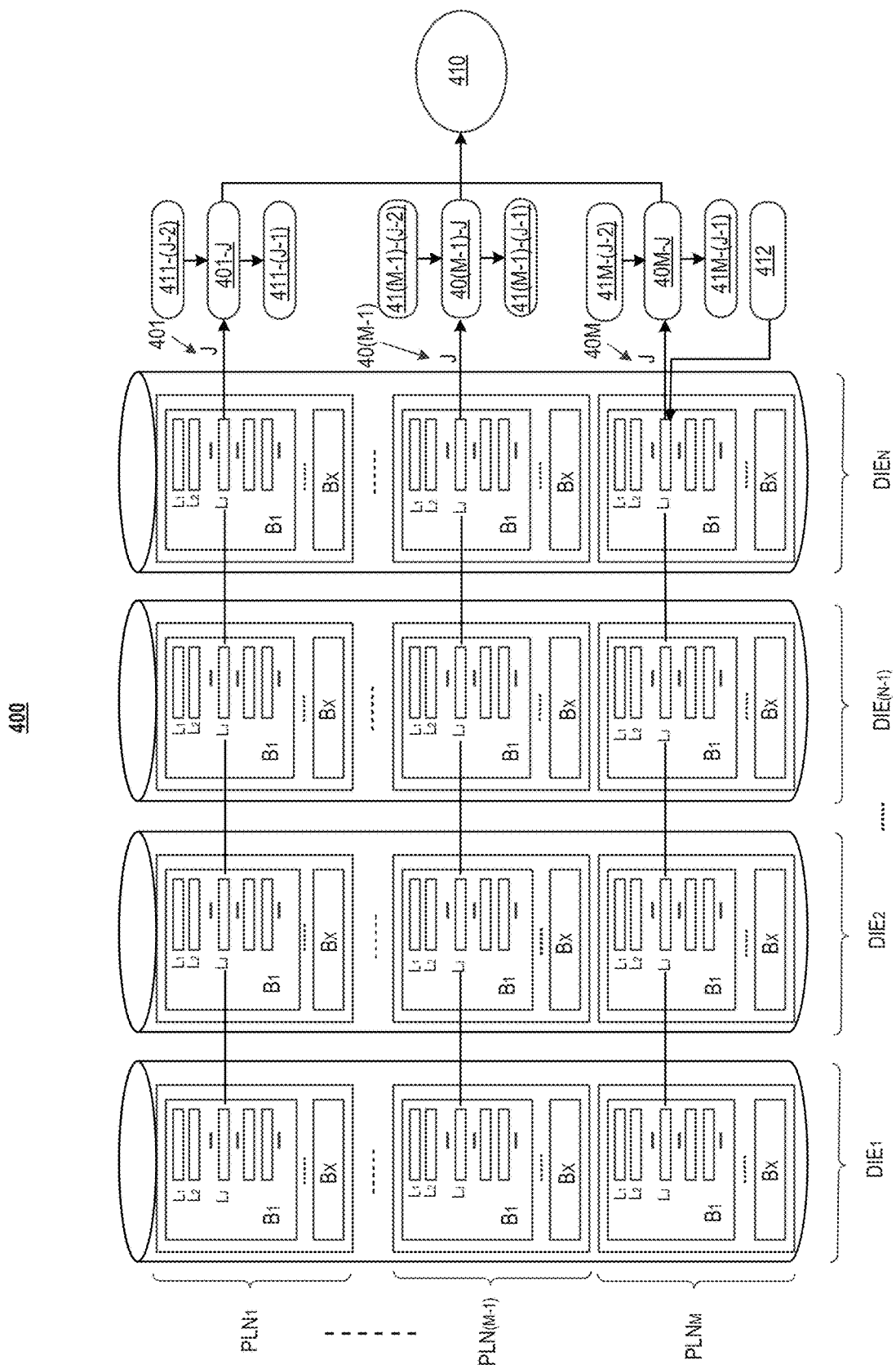
Figure 5C:
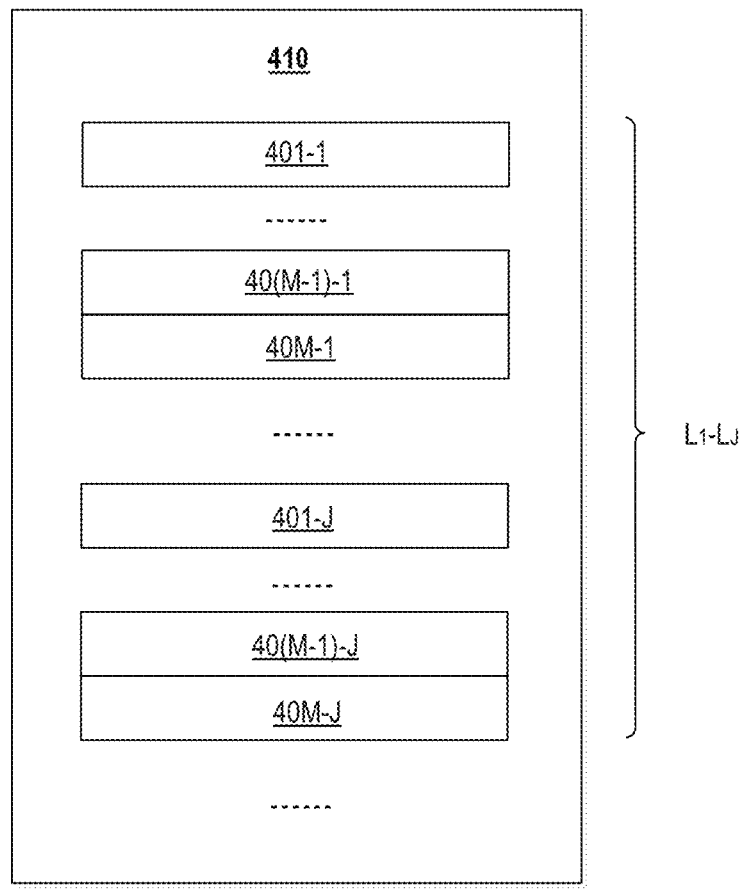
FIG. 5C illustrates exemplary parity data storage generated in the method in FIGS. 4A-4C, according to some aspects of the present disclosure.
Figure 5D:
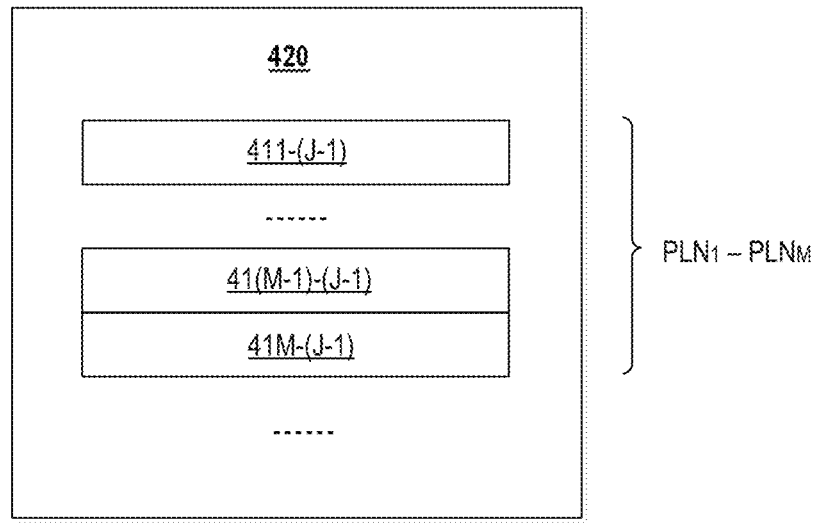
FIG. 5D illustrates another exemplary parity data storage, generated in the method in FIGS. 4A-4C, according to some aspects of the present disclosure.

FIGS. 4A-4C illustrate a striping configuration for a RAID algorithm employed in NAND memory 400, FIG. 5C illustrates a temporary storage unit 410 employed for storing temporary parity data generated according to the RAID algorithm, according to some aspects of the present disclosure, and FIG. 5D illustrates a second temporary storage unit 420 employed for storing temporary parity data generated according to the RAID algorithm, according to some implementations. The RAID algorithm can be a RAID 5. In some implementations, the striping configuration in NAND memory 400 can be used to recover memory data compromised by an SSG leakage failure, a multi-plane failure, or both. FIGS. 4A-4C, 5C, 5D, and 6C are described together.

Referring to FIG. 6C, method 640 starts at operation 642, in which J layers are determined in each memory block in the M planes and the N dies, J being a positive integer of at least 2. Each layer includes a pair of adjacent gate conductive layers. FIGS. 4A-4C illustrate a corresponding configuration for method 640. Flash memory controller 106 may perform this operation. This operation can be similar or the same as operation 602, and the detailed description is not repeated herein.

Referring back to FIG. 6C, method 640 proceeds to operation 644, in which M sets of stripes are determined, each set having J stripes. Each of the M sets corresponds to a respective one of the M planes. Each of the J stripes is configured in a single layer in the respective plane in the N dies.

As shown in FIGS. 4A-4C, J×M stripes, configured in M sets (i.e., set 401, . . . , set 40M) of stripe, each set having J stripes (i.e., stripe 1, stripe 2, . . . , stripe J), may be determined. Each of the M sets may correspond to a respective one of the M planes. Each of the J stripes may correspond to a respective one of the J layers in the respective plane. Each of the J stripes may include N data portions that are stored in the respective single layer in the N dies. Each data portion may include memory data stored in the memory cells formed by the intersections of the respective layer (i.e., the pair of adjacent gate conductive layers) in the respective memory block and the memory strings in the memory block. For example, stripe 1 of set 401 may correspond to layer $L_1$ in memory blocks $B_1$ in plane $PLN_1$, and may include N data portions stored in layer $L_1$ in memory blocks $B_1$ in plane $PLN_1$ and the N dies (i.e., $DIE_1$-$DIE_N$); and stripe J of set 40M may correspond to layer $L_J$ in memory blocks $B_1$ in plane $PLN_M$, and may include N data portions stored in layer $L_J$ in memory blocks $B_1$ in plane $PLN_M$ and the N dies. Each data portion in a stripe includes the memory data stored in the memory cells formed by the two gate conductive layers and the memory strings in the respective memory block B1 in the respective planes and the N dies. In other words, for each one of the M sets of stripes, memory data stored in layer $L_1$ in memory block $B_1$ in die $DIE_1$ may form a first data portion of stripe 1, and memory data stored in layer $L_1$ in memory block $B_1$ in die $DIE_N$ may form an $N^{th}$ data portion of stripe 1, . . . , memory data stored in layer $L_J$ in memory block $B_1$ in die $DIE_1$ may form a first data portion of stripe J, and memory data stored in layer $L_J$ in memory block $B_1$ in die $DIE_N$ may form an $N^{th}$ data portion of stripe J. In some implementations, Flash memory controller 106 may perform this operation.

As shown in FIGS. 4A-4C, the M sets of stripes are each configured in the respective plane, and the J stripes in each set are each configured in a single respective layer. That is, each stripe is configured in a single plane and a single layer. The data portions of each stripe are thus configured only in a single layer and a single plane, and are not in another layer or another plane, e.g., not "across planes" or "across layers." The striping may ensure that programming failure, e.g., multi-plane failure and/or SSG leakage failure, can only compromise a single data portion in a stripe. Multi-plane failure and/or SSG leakage failure can at most compromise memory data in different stripes. Thus, more than one compromised data portion in a stripe, caused by programming failure such as SSG leakage failure and/or multi-plane failure, can be avoided, and the compromised data portion can be recovered using the respective parity data of the stripe. Details are provided below.

Referring back to FIG. 6C, method 640 proceeds to operation 646, in which M sets of data parity portions, each set having J parity data portions, are determined for the M sets of stripes.

As shown in FIGS. 4A-4C, M sets of parity data portions, each set having J parity data portions, may be determined. Each set of parity data portions may correspond to a respective set of stripes, and each of the J parity portions in a set may correspond to a respective stripe in the respective set. As shown in FIGS. 4A-4C, a first set of parity data portions may include parity data portions 401-1, 401-2, . . . , 401-J; an $(M-1)^{th}$ set of parity data portions may include parity data portions 40(M−1)-1, 40(M−1)-2, . . . , 40(M−1)-(J−1), 40(M−1)-J; and an $M^{th}$ set of parity data portions may include parity data portions 40M-1, 40M-2, . . . , 40M-(J−1), 40M-J. Each of the parity data portions may be generated based on the data portions of the respective stripe. In some implementations, an exclusive or (XOR) operation is performed amongst the N data portions of each stripe to generate the respective parity data portion. For example, parity data portion 401-1 may be the result of the XOR operation on all N data portions of stripe 1 in set 401 of stripes, parity data portion 401-2 may be the result of the XOR operation on all N data portions of stripe 2 of set 401 of stripes, . . . , parity data portion 40M-1 may be the result of the XOR operation on all N data portions of stripe 1 of set 40M of stripes, and parity data portion 40M-J may be the result of the XOR operation on all N data portions of stripe J of set 40M of stripes. In some implementations, Flash memory controller 106 may perform this operation.

Referring back to FIG. 6C, method 640 proceeds to operation 648, in which a temporary storage unit is controlled to store the M sets of parity data portions.

As shown in FIGS. 4A-4C, a temporary storage unit 410 may be controlled to store each of the M sets of parity data portions. FIG. 5C illustrates a diagram of the temporary storage unit 410 in which the M sets of parity data portions are stored. Temporary storage unit 410 may be a storage space in any suitable medium that allows the parity data portions to be stored for a desirable amount of time. In various implementations, temporary storage unit 410 may be a partition in RAM 110 and/or a dedicated storage space in NAND memory 108. In some implementations, temporary storage unit 410 is located in RAM 110. In some implementations, the duration for which the M sets of parity data portions are stored is sufficiently long for Flash memory controller 106 to identify any programming failure, locate the compromised data portion, and use the respective layer parity data portion to recover the compromised data portion. In some implementations, the M sets of parity data portions are removed after the recovery operation is completed or no programming failure is detected. In some other implementations, the M sets of parity data portions are retained. In some implementations, Flash memory controller 106 may perform this operation.

In some implementations, for each set of parity data portions, Flash memory controller 106 may compute a temporary parity data portion. M temporary parity data portions may be determined. In some implementations, for each set of stripes, Flash memory controller 106 computes parity data portions sequentially, e.g., form the parity data portion of stripe 1 to the parity data portion of stripe J, to obtain the M sets of parity data portions. For each set of parity data portions, Flash memory controller 106 may perform an XOR operation between the second parity data portion (e.g., of stripe 2) and the first parity data portion (e.g., of stripe 1) to generate a temporary parity portion; and may perform an XOR operation between the third parity data portion (e.g., of stripe 3) and the temporary parity data portion to generate a new temporary parity data portion. Flash memory controller 106 may store the temporary parity data portion in a second temporary storage unit (now shown), and replace it with the new temporary parity data portion. The second temporary storage unit may be a partition in RAM 110 and/or a dedicated storage space in NAND memory 108. In some implementations, the second temporary storage unit may be an external storage space coupled to apparatus 100. In some implementations, the second temporary storage unit is located in RAM 110. In some implementations, the second temporary storage unit is in the same medium as temporary storage unit 410. Flash memory controller 106 may continue to compute the parity data portion of each of the rest of the J stripes, and generate a new temporary parity data portion for each of the rest of the J stripes. Flash memory controller 106 may store the J parity data portions of each set in temporary storage unit 410, and update the previous temporary parity data portion with the new temporary parity data portion in the second temporary storage unit for each of these stripes.

For example, as shown in FIGS. 4A-4C, for each of the M sets of stripes, Flash memory controller 106 may compute first parity data portions 401-1, . . . , 40(M−1)-1, 40M-1. Flash memory controller 106 may then compute second parity data portions 401-2, . . . , 40(M−1)-2, 40M-2. Flash memory controller 106 may then compute a temporary parity data portion of each set (e.g., 411-1, 412-1, . . . , 41(M−1)-1, 41M-1) by performing an XOR operation between the second parity data portion and the first parity data portion. For example, Flash memory controller 106 may determine that 411−1=401-1×401-2, 412−1=402-1× 402-2, . . . , 41(M−1)-1=40(M−1)-1×40(M−1)-2, 41M−1=40M−1×40M-2. The temporary parity data portions 411-1, 412-1, . . . , 41(M−1)-1, 41M-1 may be stored in the second temporary storage unit. Flash memory controller 106 may then compute third parity data portions 401-3, 402-3, . . . , 40(M−1)-3, 40M-3, and a new temporary parity data portion corresponding to each set of stripes. For example, Flash memory controller 106 may determine that 411-2=411-1×401-3, 412-2=412-1×402-3, . . . , 41(M−1)-2=41(M−1)-1×40(M−1)-3, 41M−2=41M−1× 40M-3. Flash memory controller 106 may replace the temporary parity data portions in the second temporary storage unit with the respective new temporary parity data portions. In some implementations, Flash memory controller 106 may repeat the above operations until the last stripe of each set. As shown in FIG. 4C, Flash memory controller 106 may determine 411-(J−1)=411-(J−2)×401-J, 412-(J−1)= 412-(J−1)×402-J, 41(M−1)-(J−1)=41(M−1)-(J−2)× 40(M−1)-J, 41M−(J−1)=41M−(J−2)×40M-J. M temporary parity data portions can then be obtained and stored in the second temporary storage unit for computation and/or reference.

In some implementations, for n=2, n representing a positive integer, Flash memory controller 106 may perform an XOR operation, on each set of stripes, between an $n^{th}$ parity data portion and an $(n-1)^{th}$ parity data portion to generate a $(n-1)^{th}$ temporary parity data portion. Flash memory controller 106 may then store the $(n-1)^{th}$ temporary parity data portion into the second temporary storage unit. For n>2, n representing a positive integer, Flash memory controller 106 may perform an XOR operation, on each set of stripes, between a parity data portion of an $n^{th}$ parity data portion and an $(n-2)^{th}$ temporary parity data portion to generate an $(n-1)^{th}$ temporary parity data portion. Flash memory controller 106 may store the $(n-1)^{th}$ temporary parity data portion in the second temporary storage unit and replace the stored $(n-2)^{th}$ temporary parity data portion with the $(n-1)^{th}$ temporary parity data portion. When n is equal to L, Flash memory controller 106 may generate M temporary parity data portions, each corresponding to a respective plane (or set of stripes). The M temporary parity data portions may be 411-(J−1), 412-(J−1), . . . , 41(M−1)-(J−1), 41M-(J−1), and may be stored in a second temporary storage unit 420, as shown in FIG. 5D. Flash memory controller 106 may perform an XOR operation amongst the M temporary parity data portions 411-(J−1), 412-(J−1), . . . , 41(M−1)-(J−1), 41M-(J−1) to generate a parity data set corresponding to J×N×M data portions in the M planes and N dies. Flash memory controller 106 may then store the parity data set in a permanent storage unit in the memory cells of NAND memory 400.

Referring back to FIG. 6C, method 640 proceeds to operation 650, in which any programming failure, e.g., due to SSG leakage failure and/or multi-plane failure, is being detected. If a programming failure is detected, method 640 proceeds to operation 652, in which the memory data stored in the compromised data portion in which the programming failure occurred is recovered using the respective parity data portion. After the recovery of the compromised data portion, method 640 proceeds to operation 654, in which a parity data set is generated from the M sets of parity data portions. If no programming failure is detected, method 640 proceeds to operation 654.

Flash memory controller 106 may determine whether any programming failure, e.g., due to SSG leakage failure and/or multi-plane failure, occurred. As previously explained, SSG leakage failure may cause the memory data in memory cells at the same location of different levels to be compromised, and the multi-plane failure may cause the memory data in memory cells at the same location of different planes to be compromised. However, the striping configuration illustrated in FIGS. 4A-4C can ensure only a single data portion, if any, in a stripe can be compromised by SSG leakage failure and/or multi-plane failure. In some implementations, Flash memory controller 106 may use the parity data portion of each stripe to determine whether any programming failure occurred in a data portion in the respective stripe. In some implementations, Flash memory controller 106 may perform an XOR operation amongst the data portions of the respective stripe and the parity data portion of the respective stripe to detect and identify the compromised data portion. The location of the compromised data portion in each (if any) stripe may be determined.

If a compromised data portion is detected in a stripe, Flash memory controller 106 may generate a replacement data portion based on the rest of the data portions (e.g., the data portions that are not compromised) in the stripe and the parity data portion of the stripe to generate the replacement data portion. In some implementations, the generation of the replacement data portion includes performing an XOR operation amongst the rest of the data portions in the stripe and the parity data portion of the stripe. Flash memory controller 106 may recover the compromised data portion with the replacement data portion such that the memory data in the compromised data portion can be retained. In some implementations, Flash memory controller 106 may access the parity data portions from temporary storage unit 410 if computation is needed, e.g., for identifying and locating a compromised data portion and/or generating a replacement data portion.

A parity data set 412 that represents the parity/redundancy data of the J layers in memory block B1 in the M planes and N dies, e.g., the J×N×M data portions, may be generated from the M temporary parity data portions. In some implementations, parity data set 412 is obtained by performing an XOR operation amongst the M temporary parity data portions. Parity data set 412 may be stored in a permanent storage unit (e.g., a plurality of memory cells) in NAND memory 400. Flash memory controller 106 may access the second temporary storage unit and perform this operation.

In some implementations, Flash memory controller 106 may continue to perform operations 642-656 for the remaining layers in memory block B1 in the M planes and N dies. The parity data portions and temporary parity data portions may be respectively stored in temporary storage unit 410 and the second temporary storage unit for computation and/or reference. The same operations may also be performed for other memory blocks in the M planes and the N dies.

Referring back to FIG. 6C, method 640 proceeds to operation 656, in which the M sets of parity data portions are removed from the temporary storage unit and the M temporary parity data portions are removed from the second temporary storage unit.

In some implementations, after the recovery of the compromised data portion(s) and the generation of the parity data set, Flash memory controller 106 may remove the J×M×N parity data portions and the M temporary parity portions. In some implementations, if no programming failure is detected, Flash memory controller 106 removes the J×M×N parity data portions and the M temporary parity portions. By recovering compromised data portion(s) in different planes and different layers using respective parity data portions, more than one compromised data portions, caused by the programming failure in the J layers in memory block $B_1$ in M planes and N dies can be recovered. Compared with a RAID method in which one stripe includes data portions across the planes and layers, the number of data portions that can be recovered/protected in these planes and layers is increased, e.g., to more than 1.

One aspect of the present disclosure provides a memory apparatus. The apparatus includes a plurality of memory cells stored with memory data in N dies. Each of the N dies includes M planes. Each of the M planes includes a memory block. N and M are each a positive integer. The apparatus also includes a controller operatively coupled to the plurality of memory cells. The controller is configured to determine J layers in the memory block in each of the M planes and in each of the N dies, each of the J layers including a pair of adjacent gate conductive layers. J is a positive integer. The controller is also configured to determine M sets of stripes. Each of the M sets of stripes including a plurality of data portions stored in a respective one of the M planes. The controller is further configured to determine M sets of parity data portions. Each of the M sets of parity data portions corresponding to a respective one of the M stripes. The controller is further configured to control a temporary storage unit to store the M sets of parity data portions.

In some implementations, the controller is configured to determine the M sets of stripes to include M stripes. Each of the M sets of stripes includes a single stripe that includes J×N data portions stored in a respective one of the M planes. Each of the J×N data portions is stored in a respective portion of the J layers. The controller is also configured to determine the M sets of parity data portions to include M parity data portions. Each of the M sets of parity data portions includes a single parity data portion corresponding to a respective plane.

In some implementations, the controller is further configured to, in response to detecting a programming failure in one of the M sets of stripes, recover the programming failure by locating a data portion and a respective stripe in which the programming failure occurs and generating a replacement data portion for the data portion using the parity data portion of the respective stripe and a rest of the data portions of the respective stripe.

In some implementations, the controller is configured to perform an XOR operation amongst the rest of the data portions and the parity data portion of the respective stripe to generate the replacement data portion.

In some implementations, the controller is further configured to program the M stripes in parallel. The programming failure includes a multi-plane failure that occurs in data portions of same locations in each of the M planes.

In some implementations, the controller is further configured to perform an XOR amongst the M parity data portions to generate a parity data set corresponding to J×N×M data portions in the M stripes, and store the parity data set in a permanent storage unit in the plurality of memory cells.

In some implementations, the controller is further configured to perform an XOR operation amongst the J×N data portions of each of the M stripes to generate the respective parity data portion.

In some implementations, the controller is configured to determine the M sets of stripes to include J×M stripes. Each of the M sets of stripes includes J stripes. In some implementations, the controller is configured to determine the J stripes to include J×N data portions. Each of the J stripes includes N data portions each being stored in a respective portion in a respective layer of the respective plane. In some implementations, the controller is configured to determine the M sets of parity data portions to include J×M parity data portions. Each of the M sets of parity data portions includes J parity data portions each corresponding to a respective one of the J stripes in a respective plane.

In some implementations, the controller is further configured to determine the N data portions stored in a single layer of the respective single plane.

In some implementations, the controller is further configured to: in response to detecting a programming failure in one of the M sets of stripes, recover the programming failure by locating a data portion and a respective stripe in which the programming failure occurs, and generating a replacement data portion for the data portion using the parity data portion of the respective stripe and a rest of the data portions of the respective stripe.

In some implementations, the controller is configured to perform an XOR operation amongst the rest of the data portions and the parity data portion of the respective stripe to generating the replacement data portion.

In some implementations, the controller is further configured to program the M sets stripes in parallel. In some implementations, the programming failure includes at least one of a SSG leakage failure or a multi-plane failure.

In some implementations, the controller is further configured to, for each of the J×M stripes, perform an XOR operation amongst the N data portions to generate the respective parity data portion.

In some implementations, the controller is further configured to, for each of the M planes, perform, for n=2, an XOR operation between an $n^{th}$ parity data portion and an $(n-1)^{th}$ parity data portion to generate an $(n-1)^{th}$ temporary parity data portion. In some implementations, the controller is also configured to store the $(n-1)^{th}$ temporary parity data portion into a second temporary storage unit. In some implementations, the controller is further configured to perform, for n>2, an XOR operation between an $n^{th}$ parity data portion and an $(n-2)^{th}$ temporary parity data portion to generate an $(n-1)^{th}$ temporary parity data portion. In some implementations, n is a positive integer, In some implementations, the controller is further configured to, for each of the M planes, store the $(n-1)^{th}$ temporary parity data portion into the second temporary storage unit to replace the $(n-2)^{th}$ temporary parity data portion.

In some implementations, the controller is further configured to: in response to n=L, perform an XOR operation amongst the $(n-1)^{th}$ temporary parity data portion corresponding to each of the M planes to generate a parity data set corresponding to J×N×M data portions in the M planes and N dies. In some implementations, the controller is also configured to store the parity data set in a permanent storage unit in the plurality of memory cells.

In some implementations, the controller is further configured to perform an XOR operation amongst the N data portions of each of the J×M stripes to generate the respective parity data portion.

In some implementations, the controller is further configured to remove the M sets of parity data portions from the temporary storage unit in response at least one of: no programming failure being detected in the M sets of stripes, or all programming failures being recovered.

In some implementations, the temporary storage unit is outside of the plurality of memory cells.

In some implementations, J is equal to 8.

In some implementations, the plurality of memory cells include NAND memory cells, and the controller includes a Flash controller.

In some implementations, the apparatus further includes a RAM, and the temporary storage unit is located in the RAM.

In some implementations, M is equal to or greater than 4.

Another aspect of the present disclosure provides a memory apparatus. The apparatus includes a plurality of memory cells stored with memory data in N dies. Each of the N dies includes M planes. Each of the M planes includes a memory block. N and M are each a positive integer. The apparatus includes a controller operatively coupled to the plurality of memory cells. The controller is configured to determine J layers in the memory block in each of the M planes and in each of the N dies. Each of the J layers includes a pair of adjacent gate conductive layers. J is a positive integer of at least 2. The controller is also configured to determine J stripes each corresponding to M layers of the same level in the M planes and including M×N data portions. Each of the M×N data portions is stored in a respective portion of the respective M layers. The controller is further configured to determine J parity data portions each corresponding to a respective stripe. The controller is further configured to control a temporary storage unit to store the J parity data portions.

In some implementations, the controller is configured to determine the M×N data portions stored in a single layer of a same level in the M planes.

In some implementations, the controller is further configured to: in response to detecting a programming failure in one of the J stripes, recover the programming failure by locating a data portion in which the programming failure occurs, and generating a replacement data portion for the data portion using the parity data portion of the respective stripe and a rest of the data portions of the respective stripe.

In some implementations, the controller is configured to perform an XOR operation amongst the rest of the data portions and the parity data portion of the respective stripe to generate the replacement data portion.

In some implementations, the programming failure includes a SSG leakage failure.

In some implementations, the controller is further configured to perform an XOR operation amongst the M×N data portions of each of the J stripes to generate the respective parity data portion.

In some implementations, the controller is further configured to perform an XOR amongst the J parity data portions to generate a parity data set corresponding to J×N×M data portions in the M stripes, and store the parity data set in a permanent storage unit in the plurality of memory cells.

In some implementations, the temporary storage unit is outside of the plurality of memory cells.

In some implementations, the controller is further configured to remove the J parity data portions from the temporary storage unit in response at least one of no programming failure being detected in the J stripes, or all programming failures being recovered.

In some implementations, J is equal to 8.

In some implementations, the plurality of memory cells include NAND memory cells, and the controller includes a Flash controller.

In some implementations, the apparatus further includes a RAM, and the temporary storage unit is located in the RAM.

In some implementations, M is equal to or greater than 4.

Another aspect of the present disclosure provides a method for operating a memory apparatus using RAID striping. The apparatus includes a plurality of memory cells stored with memory data in N dies. Each of the N dies includes M planes. Each of the M planes includes a memory block. N and M are each a positive integer. The method includes determining J layers in the memory block in each of the M planes and in each of the N dies. Each of the J layers includes a pair of adjacent gate conductive layers. J is a positive integer. The method also includes determining M sets of stripes, each of the M sets of stripes including a plurality of data portions stored in a respective one of the M planes. The method also includes determining M sets of parity data portions. Each of the M sets of parity data portions corresponds to a respective one of the M stripes. The method further includes controlling a temporary storage unit to store the M sets of parity data portions.

In some implementations, the M sets of stripes include M stripes. Each of the M sets of stripes includes a single stripe that includes J×N data portions stored in a respective one of the M planes. Each of the J×N data portions is stored in a respective portion of the J layers. The M sets of parity data portions include M parity data portions. Each of the M sets of parity data portions includes a single parity data portion corresponding to a respective plane.

In some implementations, the method further includes: in response to detecting a programming failure in one of the M sets of stripes, recovering the programming failure by locating a data portion and a respective stripe in which the programming failure occurs, and generating a replacement data portion for the data portion using the parity data portion of the respective stripe and a rest of the data portions of the respective stripe.

In some implementations, generating the replacement data portion includes performing an XOR operation amongst the rest of the data portions and the parity data portion of the respective stripe.

In some implementations, the method further includes programming the M stripes in parallel. The programming failure includes a multi-plane failure that occurs in data portions of same locations in each of the M planes.

In some implementations, the method further includes performing an XOR amongst the M parity data portions to generate a parity data set corresponding to J×N×M data portions in the M stripes, and storing the parity data set in a permanent storage unit in the plurality of memory cells.

In some implementations, the method further includes performing an XOR operation amongst the J×N data portions of each of the M stripes to generate the respective parity data portion.

In some implementations, the M sets of stripes include J×M stripes. Each of the M sets of stripes including J stripes. In some implementations, the J stripes include J×N data portions. Each of the J stripes includes N data portions each being stored in a respective portion in a respective layer of the respective plane. In some implementations, the M sets of parity data portions include J×M parity data portions. Each of the M sets of parity data portions includes J parity data portions each corresponding to a respective one of the J stripes in a respective stripe.

In some implementations, the N data portions are stored in a single layer of the respective single plane.

In some implementations, the method further includes: in response to detecting a programming failure in one of the M sets of stripes, recovering the programming failure by locating a data portion and a respective stripe in which the programming failure occurs, and generating a replacement data portion for the data portion using the parity data portion of the respective stripe and a rest of the data portions of the respective stripe.

In some implementations, generating the replacement data portion includes performing an XOR operation amongst the rest of the data portions and the parity data portion of the respective stripe.

In some implementations, the method further includes programming the M sets stripes in parallel. The programming failure includes at least one of a SSG leakage failure or a multi-plane failure.

In some implementations, the method further includes, for each of the J×M stripes, performing an XOR operation amongst the N data portions to generate the respective parity data portion.

In some implementations, the method further includes, for each of the M planes, performing, for n=2, an XOR operation between an $n^{th}$ parity data portion and an $(n-1)^{th}$ parity data portion to generate an $(n-1)^{th}$ temporary parity data portion, storing the $(n-1)^{th}$ temporary parity data into a second temporary storage unit. The method also includes performing, for n>2, an XOR operation between an nth parity data portion and an $(n-2)^{th}$ temporary parity data portion to generate an $(n-1)^{th}$ temporary parity data portion. In some implementations, n is a positive integer.

In some implementations, the method further includes, for each of the M planes, storing the $(n-1)^{th}$ temporary parity data portion into the second temporary storage unit to replace the $(n-2)^{th}$ temporary parity data portion.

In some implementations, the method further includes, in response to n=L, performing an XOR operation amongst the $(n-1)^{th}$ temporary parity data portion corresponding to each of the M planes to generate a parity data set corresponding to J×N×M data portions in the M planes and N dies, and storing the parity data set in a permanent storage unit in the plurality of memory cells.

In some implementations, the method further includes performing an XOR operation amongst the N data portions of each of the J×M stripes to generate the respective parity data portion.

In some implementations, the method further includes removing the M sets of parity data portions from the temporary storage unit in response at least one of no programming failure being detected in the M sets of stripes, or all programming failures being recovered.

Another aspect of the present disclosure further provide a method for operating a memory apparatus using RAID striping. The apparatus includes a plurality of memory cells stored with memory data in N dies. Each of the N dies includes M planes. Each of the M planes includes a memory block. N and M are each a positive integer. The method includes determining J layers in the memory block in each of the M planes and in each of the N dies. Each of the J layers includes a pair of adjacent gate conductive layers. J is a positive integer of at least 2. The method also includes determining J stripes each corresponding to M layers of the same level in the M planes and including M×N data portions. Each of the M×N data portions is stored in a respective portion of the respective M layers. The method further includes determining J parity data portions each corresponding to a respective stripe. The method further includes controlling a temporary storage unit to store the J parity data portions.

In some implementations, the M×N data portions are stored in a single layer of a same level in the M planes.

In some implementations, the method further includes, in response to detecting a programming failure in one of the J stripes, recovering the programming failure by locating a data portion in which the programming failure occurs, and generating a replacement data portion for the data portion using the parity data portion of the respective stripe and a rest of the data portions of the respective stripe.

In some implementations, generating the replacement data portion includes performing an XOR operation amongst the rest of the data portions and the parity data portion of the respective stripe.

In some implementations, the programming failure includes a SSG leakage failure.

In some implementations, the method further includes performing an XOR operation amongst the M×N data portions of each of the J stripes to generate the respective parity data portion.

In some implementations, the method further includes performing an XOR amongst the J parity data portions to generate a parity data set corresponding to J×N×M data portions in the M stripes, and storing the parity data set in a permanent storage unit in the plurality of memory cells.

In some implementations, the temporary storage unit is outside of the plurality of memory cells.

In some implementations, the method further includes removing the J parity data portions from the temporary storage unit in response at least one of no programming failure being detected in the J stripes, or all programming failures being recovered.

The foregoing description of the specific implementations can be readily modified and/or adapted for various applications. Therefore, such adaptations and modifications are intended to be within the meaning and range of equivalents of the disclosed implementations, based on the teaching and guidance presented herein. The breadth and scope of the present disclosure should not be limited by any of the above-described exemplary implementations, but should be defined only in accordance with the following claims and their equivalents.

What is claimed is:

1. A memory apparatus, comprising:
   a plurality of memory cells stored with memory data in N dies, each of the N dies comprising M planes, each of the M planes comprising a memory block, N and M each being a positive integer; and
   a controller operatively coupled to the plurality of memory cells, the controller being configured to:
   determine J layers in the memory block in each of the M planes and in each of the N dies, each of the J layers comprising a pair of adjacent gate conductive layers, J being a positive integer;
   determine M sets of stripes, each of the M sets of stripes comprising a plurality of data portions stored in a respective one of the M planes;
   determine M sets of parity data portions, each of the M sets of parity data portions corresponding to a respective one of the M stripes; and
   control a temporary storage unit to store the M sets of parity data portions.

2. The memory apparatus of claim 1, wherein the controller is configured to determine:
   the M sets of stripes to comprise M stripes, each of the M sets of stripes comprising a single stripe that comprises J×N data portions stored in a respective one of the M planes, each of the J×N data portions being stored in a respective portion of the J layers; and
   the M sets of parity data portions to comprise M parity data portions, each of the M sets of parity data portions comprising a single parity data portion corresponding to a respective plane.

3. The memory apparatus of claim 1, wherein the controller is further configured to:
   in response to detecting a programming failure in one of the M sets of stripes, recover the programming failure by:
   locating a data portion and a respective stripe in which the programming failure occurs; and
   generating a replacement data portion for the data portion using the parity data portion of the respective stripe and a rest of the data portions of the respective stripe.

4. The memory apparatus of claim 3, wherein the controller is configured to perform an exclusive or (XOR) operation amongst the rest of the data portions and the parity data portion of the respective stripe to generate the replacement data portion.

5. The memory apparatus of claim 3, wherein the controller is further configured to program the M stripes in parallel, wherein the programming failure comprises a multi-plane failure that occurs in data portions of same locations in each of the M planes.

6. The memory apparatus of claim 2, wherein the controller is further configured to:
   perform an exclusive or (XOR) amongst the M parity data portions to generate a parity data set corresponding to J×N×M data portions in the M stripes; and
   store the parity data set in a permanent storage unit in the plurality of memory cells.

7. The memory apparatus of claim 2, wherein the controller is further configured to perform an exclusive or (XOR) operation amongst the J×N data portions of each of the M stripes to generate the respective parity data portion.

8. The memory apparatus of claim 1, wherein the controller is configured to determine:
the M sets of stripes to comprise J×M stripes, each of the M sets of stripes comprising J stripes;
the J stripes to comprise J×N data portions, each of the J stripes comprising N data portions each being stored in a respective portion in a respective layer of the respective plane; and
the M sets of parity data portions to comprise J×M parity data portions, each of the M sets of parity data portions comprising J parity data portions each corresponding to a respective one of the J stripes in a respective plane.

9. The memory apparatus of claim 8, wherein the controller is further configured to determine the N data portions stored in a single layer of the respective single plane.

10. The memory apparatus of claim 8, wherein the controller is further configured to: in response to detecting a programming failure in one of the M sets of stripes, recover the programming failure by:
locating a data portion and a respective stripe in which the programming failure occurs; and
generating a replacement data portion for the data portion using the parity data portion of the respective stripe and a rest of the data portions of the respective stripe.

11. The memory apparatus of claim 10, wherein the controller is configured to perform an exclusive or (XOR) operation amongst the rest of the data portions and the parity data portion of the respective stripe to generating the replacement data portion.

12. The memory apparatus of claim 10, wherein:
the controller is further configured to program the M sets stripes in parallel; and
the programming failure comprises at least one of a source-select gate (SSG) leakage failure or a multi-plane failure.

13. The memory apparatus of claim 8, wherein the controller is further configured to, for each of the J×M stripes, perform an exclusive or (XOR) operation amongst the N data portions to generate the respective parity data portion.

14. The memory apparatus of claim 8, wherein the controller is further configured to, for each of the M planes, n being a positive integer,
perform, for n=2, an exclusive or (XOR) operation between an $n^{th}$ parity data portion and an $(n-1)^{th}$ parity data portion to generate an $(n-1)^{th}$ temporary parity data portion;
store the $(n-1)^{th}$ temporary parity data portion into a second temporary storage unit; and
perform, for n>2, an XOR operation between an $n^{th}$ parity data portion and an $(n-2)^{th}$ temporary parity data portion to generate an $(n-1)^{th}$ temporary parity data portion.

15. The memory apparatus of claim 14, wherein the controller is further configured to,
for each of the M planes, store the $(n-1)^{th}$ temporary parity data portion into the second temporary storage unit to replace the $(n-2)^{th}$ temporary parity data portion;
in response to n=L, perform an XOR operation amongst the $(n-1)^{th}$ temporary parity data portion corresponding to each of the M planes to generate a parity data set corresponding to J×N×M data portions in the M planes and N dies; and
store the parity data set in a permanent storage unit in the plurality of memory cells.

16. A memory apparatus, comprising:
a plurality of memory cells stored with memory data in N dies, each of the N dies comprising M planes, each of the M planes comprising a memory block, N and M each being a positive integer; and
a controller operatively coupled to the plurality of memory cells, the controller being configured to:
determine J layers in the memory block in each of the M planes and in each of the N dies, each of the J layers comprising a pair of adjacent gate conductive layers, J being a positive integer of at least 2; and
determine J stripes each corresponding to M layers of the same level in the M planes and comprising M×N data portions, each of the M×N data portions being stored in a respective portion of the respective M layers;
determine J parity data portions each corresponding to a respective stripe; and
control a temporary storage unit to store the J parity data portions.

17. The memory apparatus of claim 16, wherein the controller is configured to determine the M×N data portions stored in a single layer of a same level in the M planes.

18. The memory apparatus of claim 16, wherein the controller is further configured to: in response to detecting a programming failure in one of the J stripes, recover the programming failure by:
locating a data portion in which the programming failure occurs; and
generating a replacement data portion for the data portion using the parity data portion of the respective stripe and a rest of the data portions of the respective stripe, wherein the programming failure comprises a source-select gate (SSG) leakage failure.

19. The memory apparatus of claim 18, wherein the controller is configured to perform an exclusive or (XOR) operation amongst the rest of the data portions and the parity data portion of the respective stripe to generate the replacement data portion.

20. A method for operating a memory apparatus using redundant array of independent disks (RAID) striping, the apparatus comprising a plurality of memory cells stored with memory data in N dies, each of the N dies comprising M planes, each of the M planes comprising a memory block, N and M each being a positive integer, the method comprising:
determining J layers in the memory block in each of the M planes and in each of the N dies, each of the J layers comprising a pair of adjacent gate conductive layers, J being a positive integer;
determining M sets of stripes, each of the M sets of stripes comprising a plurality of data portions stored in a respective one of the M planes;
determining M sets of parity data portions, each of the M sets of parity data portions corresponding to a respective one of the M stripes; and
controlling a temporary storage unit to store the M sets of parity data portions.

* * * * *